US012666696B2

(12) United States Patent
Pala et al.

(10) Patent No.: US 12,666,696 B2
(45) Date of Patent: Jun. 23, 2026

(54) SEMICONDUCTOR DEVICE WITH INTEGRATED JUNCTION FIELD EFFECT TRANSISTOR AND ASSOCIATED MANUFACTURING METHOD

(71) Applicant: Monolithic Power Systems, Inc., Kirkland, WA (US)

(72) Inventors: Vipindas Pala, San Jose, CA (US); Sauvik Chowdhury, San Jose, CA (US)

(73) Assignee: Monolithic Power Systems, Inc., Kirkland, WA (US)

( * ) Notice: Subject to any disclaimer, the term of this patent is extended or adjusted under 35 U.S.C. 154(b) by 505 days.

(21) Appl. No.: 18/446,281

(22) Filed: Aug. 8, 2023

(65) Prior Publication Data

US 2024/0055512 A1     Feb. 15, 2024

Related U.S. Application Data

(60) Provisional application No. 63/398,120, filed on Aug. 15, 2022.

(51) Int. Cl.
| | |
|---|---|
| *H10D 84/00* | (2025.01) |
| *H10D 30/01* | (2025.01) |
| *H10D 30/60* | (2025.01) |
| *H10D 30/66* | (2025.01) |
| *H10D 30/83* | (2025.01) |
| *H10D 62/10* | (2025.01) |

(52) U.S. Cl.
CPC ....... *H10D 84/141* (2025.01); *H10D 30/0291* (2025.01); *H10D 30/0297* (2025.01); *H10D 30/0512* (2025.01); *H10D 30/615* (2025.01); *H10D 30/668* (2025.01); *H10D 30/83* (2025.01); *H10D 30/831* (2025.01); *H10D 62/107* (2025.01); *H10D 62/127* (2025.01)

(58) Field of Classification Search
CPC .. H10D 30/615; H10D 30/668; H10D 30/831; H10D 62/107; H10D 84/141
See application file for complete search history.

(56) References Cited

U.S. PATENT DOCUMENTS

| | | | | |
|---|---|---|---|---|
| 2002/0185679 A1* | 12/2002 | Baliga | ............... | H10D 30/65 |
| | | | | 257/329 |
| 2020/0203482 A1* | 6/2020 | Kaji | ............... | H10D 30/668 |
| 2020/0295186 A1* | 9/2020 | Jacke | ............... | H10D 62/8325 |

* cited by examiner

*Primary Examiner* — Daniel P Shook
(74) *Attorney, Agent, or Firm* — Perkins Coie LLP

(57) ABSTRACT

A semiconductor device includes a first source region, a first sidewall body region, a gate region, a second source region and a link region formed in a substrate of a first conductivity type. The first source region and the second source region may be of the first conductivity type while the first sidewall body region and the link region may be of a second conductivity type opposite to the first conductivity type. The link region and the gate region are respectively disposed at a first side and a second side of the first source region. The first sidewall body region may be disposed below or underneath the first source region.

28 Claims, 23 Drawing Sheets

N-          102

N+          101

L1

103

104

501          S1

N+

P-

N+

108

N-          102

L1

SEMICONDUCTOR DEVICE WITH INTEGRATED JUNCTION FIELD EFFECT TRANSISTOR AND ASSOCIATED MANUFACTURING METHOD

CROSS-REFERENCE TO RELATED APPLICATIONS

The present application claims the benefit of U.S. Provisional Patent Application No. 63/398,120, filed on Aug. 15, 2022, which is incorporated herein by reference in its entirety.

TECHNICAL FIELD

This disclosure relates generally to semiconductor devices, and more particularly but not exclusively relates to semiconductor device having junction field effect transistor integrated therein and associated manufacturing method.

BACKGROUND

Power transistors, such as high voltage metal-oxide semiconductor (MOS) transistors are widely used in various power management applications, including used as power switching elements in power management devices for industrial and/or consumer electronic equipment. In most high power applications, transistors with high voltage tolerance, low on resistance and high power handling capacity are desired.

BRIEF DESCRIPTION OF DRAWINGS

The following detailed description of various embodiments of the present invention can best be understood when read in conjunction with the following drawings, in which the features are not necessarily drawn to scale but rather are drawn as to best illustrate the pertinent features.

SUMMARY

Figure 1:
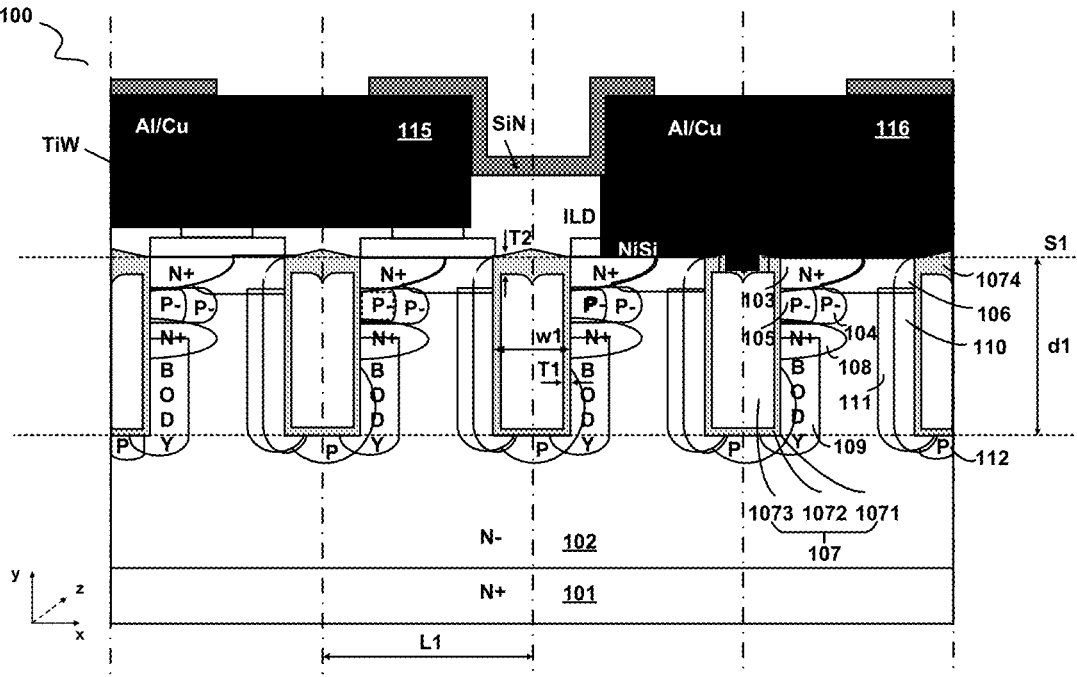
FIG. 1 illustrates a partial cross sectional view of a semiconductor device 100 in accordance with an embodiment of the present invention.

There has been provided, in accordance with an embodiment of the present disclosure, a semiconductor device including a semiconductor layer of a first conductivity type and an epitaxial layer of the first conductivity type formed on the semiconductor layer. The semiconductor device may further include a first source region of the first conductivity type formed in the epitaxial layer and near a top surface of the epitaxial layer, and a first sidewall body region of a second conductivity type disposed below or underneath the first source region, wherein the second conductivity type may be opposite to the first conductivity type. The semiconductor device may further include a body contact region of the second conductivity type, formed closely next to or in adjoining neighbor to the first source region, and disposed in the epitaxial layer at a first side of the first source region. The semiconductor device may further include a gate region, formed in the epitaxial layer closely next to or in adjoining neighbor to the first source region, and disposed in the epitaxial layer at a second side of the first source region. The semiconductor device may further include a second source region of the first conductivity type formed below or underneath the first sidewall body region in the epitaxial layer, and a link region of the second conductivity type disposed at the first side of the first source region and having a portion disposed deeper than a bottom surface the body contact region in the epitaxial layer.

There has been provided, in accordance with an embodiment of the present disclosure, a semiconductor device having a plurality of transistor cells. Each one of the plurality of transistor cells may include: a semiconductor layer of a first conductivity type and an epitaxial layer of the first conductivity type formed on the semiconductor layer; a first source region of the first conductivity type formed in the epitaxial layer and near a top surface of the epitaxial layer; a first sidewall body region of a second conductivity type disposed below or underneath the first source region, wherein the second conductivity type may be opposite to the first conductivity type; a body contact region of the second conductivity type, formed closely next to or in adjoining neighbor to the first source region, and disposed in the epitaxial layer at a first side of the first source region; a gate region, formed in the epitaxial layer closely next to or in adjoining neighbor to the first source region, and disposed in the epitaxial layer at a second side of the first source region; a second source region of the first conductivity type formed below or underneath the first sidewall body region in the epitaxial layer; and a link region of the second conductivity type disposed at the first side of the first source region and having a portion disposed deeper than a bottom surface the body contact region in the epitaxial layer.

There has also been provided, in accordance with an embodiment of the present disclosure, a semiconductor device including a drain region of a first conductivity type disposed adjacent a first surface of a substrate of the semiconductor device, a first source region of the first conductivity type disposed adjacent a second surface of the substrate, a first sidewall body region of a second conductivity type disposed below or underneath the first source region and a gate region disposed next to or in adjoining neighbor to the first source region. The semiconductor device may further include a second source region of the first conductivity type, disposed below or underneath the first sidewall body region, and a link region of the second conductivity type, disposed spatially opposite to the gate region and having a portion extended vertically down into the substrate deeper than the second source region.

There has also been provided, in accordance with an embodiment of the present disclosure, a semiconductor device having a plurality of transistor cells. Each one of the plurality of transistor cells may include: a drain region of a first conductivity type, disposed adjacent a first surface of a substrate of the semiconductor device; a first source region of the first conductivity type disposed adjacent a second surface of the substrate; a first sidewall body region of a second conductivity type disposed below or underneath the first source region and a gate region disposed next to or in adjoining neighbor to the first source region; a second source region of the first conductivity type, disposed below or underneath the first sidewall body region; and a link region of the second conductivity type, disposed spatially opposite to the gate region and having a portion extended vertically down into the substrate deeper than the second source region.

There has also been provided, in accordance with an embodiment of the present disclosure, a semiconductor device having a plurality of transistor cells. Each one of the plurality of transistor cells may include a metal oxide semiconductor Field effect transistor ("MOSFET") cell formed in a substrate, and a junction field effect transistor ("JFET") cell corresponding to the MOSFET cell and formed in the substrate. The MOSFET cell may include a drain region of a first conductivity type disposed adjacent a first surface of the substrate, a first source region of the first conductivity type disposed adjacent a second surface opposite to the first surface of the substrate, a first sidewall body region of a second conductivity type opposite to the first conductivity type and disposed below or underneath the first source region, and a gate region disposed next to or in adjoining neighbor to the first source region. The JFET cell may include a second source region of the first conductivity type disposed below or underneath the first sidewall body region, and a link region of the second conductivity type disposed at a first side of the first source region and spatially opposite to the gate region.

There has also been provided, in accordance with an embodiment of the present disclosure, a method for manufacturing a semiconductor device. The method may include: preparing a substrate of a first conductivity type having a drain region doped at least adjacent a first surface of the substrate; forming a first source region of the first conductivity type and a second source region of the first conductivity type in the substrate, wherein the first source region is formed adjacent a second surface of the substrate opposite to the first surface, and wherein the second source region is formed below the first source region and separated from the first source region; forming a gate trench of a gate region in the substrate such that the gate trench is disposed closely next to or in adjoining neighbor to the first source region; forming a first sidewall body region of a second conductivity type below or underneath the first source region to separate the first source region from the second source region; forming a link region of the second conductivity type such that the link region and the gate trench are respectively disposed at a first side of the first source region and a second side of the first source region, the first side of the first source region being opposite to the second side of the first source region; forming a gate insulation layer to coat and line sidewalls and a bottom of the gate trench; and using a gate conductive material to fill the gate trench. In an example, preparing the substrate may include forming an epitaxial layer atop a semiconductor layer having the drain region doped adjacent a first surface of the semiconductor layer, wherein the drain region may have a drain dopant concentration higher than an epitaxial dopant concentration of the epitaxial layer. In an example, forming the epitaxial layer may include: forming a first portion of the epitaxial layer of the first conductivity type atop a second surface of the semiconductor layer, the second surface of the semiconductor layer being opposite to the first surface of the semiconductor layer; forming a buried layer of the first conductivity type in or on the first portion of the epitaxial layer, wherein the buried layer functions as the second source region and has a second source dopant concentration higher than an epitaxial dopant concentration of the epitaxial layer; and forming a second portion of the epitaxial layer of the first conductivity type on the buried layer.

There has also been provided, in accordance with an embodiment of the present disclosure, a method for manufacturing a semiconductor device. The method may include: preparing a semiconductor layer of a first conductivity type having a drain region doped at least adjacent a first surface of the semiconductor layer; forming a first portion of an epitaxial layer of the first conductivity type atop a second surface of the semiconductor layer, the second surface of the semiconductor layer being opposite to the first surface of the semiconductor layer; forming a buried layer of the first conductivity type in or on the first portion of the epitaxial layer, wherein the buried layer has a second source dopant concentration higher than an epitaxial dopant concentration of the epitaxial layer; forming a second portion of the epitaxial layer of the first conductivity type on the buried layer; forming a first source region of the first conductivity type in the second portion of the epitaxial layer and adjacent a top surface of the second portion of the epitaxial layer; forming a gate trench of a gate region in the epitaxial layer such that the gate trench is disposed closely next to or in adjoining neighbor to the first source region; forming a first sidewall body region of a second conductivity type below or underneath the first source region to separate the first source region from the buried layer, wherein the buried layer functions as a second source region; forming a link region of the second conductivity type below or underneath the body contact region such that the link region and the gate trench are respectively disposed at a first side of the first source region and a second side of the first source region, the first side of the first source region being opposite to the second side of the first source region; forming a gate insulation layer to coat and line sidewalls and a bottom of the gate trench; and using a gate conductive material to fill the gate trench.

DETAILED DESCRIPTION

Various embodiments of the present invention will now be described. In the following description, some specific details, such as example circuits and example values for these circuit components, are included to provide a thorough understanding of embodiments. One skilled in the relevant art will recognize, however, that the present invention can be practiced without one or more specific details, or with other methods, components, materials, etc. In other instances, well-known structures, materials, processes or operations are not shown or described in detail to avoid obscuring aspects of the present invention.

Throughout the specification and claims, the term "coupled," as used herein, is defined as directly or indirectly connected in an electrical or non-electrical manner. When an element is described as "connected" or "coupled" to another element, it can be directly connected or coupled to the other element, or there could exist one or more intermediate elements. In contrast, when an element is referred to as "directly connected" or "directly coupled" to another element, there is no intermediate element. The terms "a," "an," and "the" include plural reference, and the term "in" includes "in" and "on". The phrase "in one embodiment," as used herein does not necessarily refer to the same embodiment, although it may. The term "or" is an inclusive "or" operator, and is equivalent to the term "and/or" herein, unless the context clearly dictates otherwise. The term "based on" is not exclusive and allows for being based on additional factors not described, unless the context clearly dictates otherwise. The term "circuit" means at least either a single component or a multiplicity of components, either active and/or passive, that are coupled together to provide a desired function. The term "signal" means at least one current, voltage, charge, temperature, data, or other signal. Those skilled in the art should understand that the meanings of the terms identified above do not necessarily limit the terms, but merely provide illustrative examples for the terms.

The terms "comprise", "include", "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus.

The terms "left," "right," "in," "out," "front," "back," "up," "down, "top," "atop", "bottom," "over," "under," "above," "below" and the like in the description and the claims, if any, are used for descriptive purposes and not necessarily for describing permanent relative positions. It is to be understood that the terms so used are interchangeable under appropriate circumstances such that embodiments of the invention described herein are, for example, capable of operation in other orientations than those illustrated or otherwise described herein.

For convenience of explanation, the present disclosure takes an N-channel vertical device manufactured on and/or in silicon carbide ("SiC") semiconductor substrates for example for the explanation, but this is not intended to be limiting and persons of skill in the art will understand that the structure and principles taught herein also apply to P-channel vertical devices wherein, for example, the conductivity types of the various regions shown herein are replaced by their opposites, and to other types of semiconductor materials and devices as well. While poly-silicon is preferred for filling the gate trenches used in embodiments of the present disclosure, the embodiments are not limited to this choice of conductor and other types of materials (e.g., metals, other semiconductors, semi-metals, and/or combinations thereof) that are compatible with other aspects of the device manufacturing process may also be used. Thus, the terms "poly-filled" and "poly-silicon filled" are intended to include such other materials and material combinations in addition to poly-silicon.

FIG. 1 illustrates a partial cross sectional view of a semiconductor device, for instance a vertical transistor 100 in accordance with an embodiment of the present invention. The cross-sectional view in FIG. 1 may be considered as illustrated out in a 3 dimensional coordinate system having the x axis, y axis and z axis perpendicular to one another. It may be understood that the illustrative cross sectional view is inspected from/taken from a cutting plane parallel to the x-y plane defined by the x and y axis. Throughout this disclosure, lateral may refer to a direction parallel to the x axis while vertical may refer to a direction parallel to the y axis. The semiconductor device 100 may be formed in/on a substrate including a semiconductor layer 101 of a first conductivity type (e.g. N type). The semiconductor layer 101 may comprise one or more of the semiconductor materials such as Si, Ge, SiC, SiGe, GaN, GaAs or other forms of semiconductor layers. In an example, the semiconductor layer 101 may be doped to have a first dopant concentration (e.g. may also be referred to as a drain dopant concentration) at least adjacent a first surface (e.g. the bottom surface of the semiconductor layer 101 in the example of FIG. 1) of the semiconductor layer 101 so that a drain region of the semiconductor device 100 may be formed. The drain region may be referred to as being "highly doped" or "heavily doped" by those skilled in the art (e.g. illustrated as an N+ layer in FIG. 1). In an embodiment, the first dopant concentration may be in a range from 1e18 cm$^{-3}$ to 1e20 cm$^{-3}$. A relatively thick epitaxial layer 102 of the first conductivity type (e.g. N type) may be formed on the semiconductor layer 101. In an embodiment, the epitaxial layer 102 may comprise one or more of the semiconductor materials such as Si, Ge, SiC, SiGe, GaN, GaAs or any other suitable semiconductor materials. In an embodiment, the epitaxial layer 102 may be formed of semiconductor materials identical to those of the semiconductor layer 101. In an embodiment, the epitaxial layer 102 may be doped with dopants of the first conductivity to have a second dopant concentration (e.g. may also be referred to as an epitaxial dopant concentration). The second dopant concentration may be lower than the first dopant concentration. For instance, the epitaxial layer 102 is illustrated by an N− layer in FIG. 1. For instance, in an embodiment, the second dopant concentration may range from 1e14 cm$^{-3}$ to 1e18 cm$^{-3}$. In an embodiment, the second dopant concentration may range from 1e14 cm$^{-3}$ to 1e16 cm$^{-3}$. In an embodiment, the substrate of the semiconductor device 100 may collectively include the semiconductor layer 101 and the epitaxial layer 102. One of ordinary skill in the art would understand that this is not intended to be limiting, in an alternative embodiment, the substrate of the semiconductor device 100 may not include the epitaxial layer 102. In other alternative embodiments, the substrate of the semiconductor device 100 may include single or multiple non-epitaxial or epitaxial semiconductor layers comprising one or more of the semiconductor materials such as Si, Ge, SiC, SiGe, GaN, GaAs or any other suitable semiconductor materials. The drain region may be formed at least adjacent a first surface of the substrate of the semiconductor device 100.

In accordance with an exemplary embodiment of the present invention, the semiconductor device 100 may include for example a plurality of vertical transistor cells. Herein, the term "a plurality of" is not limited to more than one but intended to include one. In the example illustratively shown in FIG. 1, vertical dashed lines illustratively represent boundaries of each vertical transistor cell. For each one of the plurality of vertical transistor cells, a first source region (e.g. which may function as a MOSFET source region in an example) 103 may be formed in the substrate and disposed adjacent a second surface of the substrate opposite to the first surface of the substrate. In the example illustratively shown in FIG. 1, the first source region 103 may be formed in the epitaxial layer 102 and near the top surface S1 (e.g. indicated by a dashed line in the cross sectional view of the example in FIG. 1) of the epitaxial layer 102 for each one of the plurality of vertical transistor cells. The first source region 103 may be of the first conductivity type (e.g. N type) and may have a third dopant concentration (e.g. may also be referred to as a first source dopant concentration) so that the first source region 103 may serve/function as a source region of the semiconductor device 100, and thus may be referred to as being "highly doped" or "heavily doped" by those skilled in the art (e.g. illustrated as an N+ region in FIG. 1). In an embodiment, the third dopant concentration may be higher than the second dopant concentration. In an embodiment, the third dopant concentration may be at the same order of magnitude as or may be identical to the first dopant concentration. In an embodiment, for example, the third dopant concentration may be in a range from 1e19 cm$^{-3}$ to 5e20 cm$^{-3}$.

In accordance with an exemplary embodiment, a first sidewall body region 105 of a second conductivity type (e.g. P type) may be disposed below or underneath the first source region 103 of each one of the plurality of vertical transistor cells in the substrate (e.g. in the epitaxial layer 102 for the example of FIG. 1). The second conductivity type may be opposite to the first conductivity type. In the example of FIG. 1, the first sidewall body region 105 is illustratively shown as a P region and may have a fourth dopant concentration (e.g. may also be referred to as a first body dopant concentration). In an embodiment, the fourth dopant concentration may be in a range from 5e16 cm$^{-3}$ to 1e18 cm$^{-3}$.

In accordance with an exemplary embodiment, for each one of the plurality of vertical transistor cells, a body contact region 106 of the second conductivity type (e.g. P type) may be formed closely next to or in adjoining neighbor to the first source region 103 in the substrate at a first side of the first source region 103. The body contact region 106 may be disposed adjacent to the second surface of the substrate and laterally next to or neighboring to the first source region 103. In the example illustratively shown in FIG. 1, the body contact region 106 may be formed closely next to or in adjoining neighbor to the first source region 103 in each one of the plurality of vertical transistor cells in the epitaxial layer 102 at a first side of the first source region 103. In the example of FIG. 1, the body contact region 106 is illustratively shown as a P+ region formed at the right side of the first source region 103 and may have a fifth dopant concentration (e.g. may also be referred to as a body contact dopant concentration). The fifth dopant concentration may be higher than the fourth dopant concentration. In an embodiment, for example, the fifth dopant concentration may be in a range from 5e18 cm$^{-3}$ to 1e20 cm$^{-3}$. In accordance with an exemplary embodiment of the present invention, the body contact region 106 may contact with the first source region 103 and the first sidewall body region 105 to electrically connect to the first source region 103 and the first sidewall body region 105.

In accordance with an exemplary embodiment of the present invention, in the case that the first sidewall body region 105 is not contacting with the body contact region 106, a lightly doped region 104 of the second conductivity type (e.g. P type) may further be formed below or underneath the first source region 103 of each one of the plurality of vertical transistor cells. For this situation, the first sidewall body region 105 may be formed in the lightly doped region 104 and the lightly doped region 104 may laterally extend beyond the first sidewall body region 105 to contact with the body contact region 106, so that the first sidewall body region 105 is electrically connected to the body contact region 106 via the lightly doped region 104 for each one of the plurality of vertical transistor cells. In the example of FIG. 1, the lightly doped region 104 is illustratively shown as a P− region and may have a sixth dopant concentration (e.g. may also be referred to as a connecting region dopant concentration). The sixth dopant concentration may be lower than the fourth dopant concentration. In an embodiment, the sixth dopant concentration may be in a range from 5e16 cm$^{-3}$ to 1e18 cm$^{-3}$.

In accordance with an exemplary embodiment of the present invention, for each one of the plurality of vertical transistor cells, a gate region 107 disposed in a gate trench 1071 may be formed in the substrate and may be disposed closely next to or in adjoining neighbor to the first source region 103 at a second side of the first source region 103. The second side of the first source region 103 is opposite to the first side of the first source region 103 in each one of the plurality of vertical transistor cells. In the example of FIG. 1, the gate region 107 is illustratively shown being disposed at the left side of the first source region 103 of each one of the plurality of vertical transistor cells. The gate trench 1071 may be opened (e.g. by etching) from the second surface of the substrate (e.g. the top surface S1 of the epitaxial layer 102 in the example of FIG. 1) and extended vertically into the substrate (e.g. into the epitaxial layer 102 in the example of FIG. 1) with a predetermined gate trench depth d1 and a predetermined gate trench width w1. In an embodiment, the predetermined gate trench depth d1 may range from 1.0 μm to 3.0 µm. In an embodiment, the predetermined gate trench width w1 may range from 0.25 µm to 2.0 µm.

In the example of FIG. 1, the gate trench 1071 of each one of the plurality of vertical transistor cells may be lined with a gate insulation layer 1072 (e.g. a gate oxide layer) on the sidewalls and bottom of each gate trench 1071 and then be filled with a gate conductive material 1073 (such as heavily-doped polysilicon). In an embodiment, the gate insulation layer 1072 may have a predetermined gate insulation thickness T1. In an embodiment, the predetermined gate insulation thickness T1 may range from 20 nm to 100 nm. In an embodiment, still referring to the illustration in the example of FIG. 1, the gate conductive material 1073 in each one of the gate trenches 1071 may further be wrapped or capped by a gate capping layer 1074 formed of insulation materials such as silicon dioxide or any other suitable isolation materials. The gate capping layer 1074 may be disposed atop the gate conductive material 1073 in each one of the gate trenches 1071 and physically joint/merged with the gate insulation layer 1072 so that the gate capping layer 1074 together with the gate insulation layer 1072 form a continuous insulation cage enclosing the gate conductive material 1073 in each one of the gate trenches 1071. In an embodiment, the gate capping layer 1074 may have a predetermined capping thickness T2. In an embodiment, the predetermined capping thickness T2 may range from 50 nm to 500 nm.

In accordance with an exemplary embodiment of the present invention, the semiconductor device 100 may have a short metal oxide semiconductor Field effect transistor ("MOSFET") channel (e.g., illustrated by an area in the dashed frame in FIG. 1) formed in the first sidewall body region 105 for each one of the plurality of vertical transistor cells to allow current flowing between the drain region 101 and the first source region 103 when appropriate voltages are applied on the drain region 101, the first source region 103 and the gate region 107 to turn the semiconductor device 100 on (i.e. to let the semiconductor device 100 operate in an on state or a conducting state). For example, in an embodiment, the short MOSFET channel may have a MOSFET channel width in a range from 0.1 µm to 0.8 µm. In an embodiment, the MOSFET channel width may be in a range from 0.2 µm to 0.45 µm. In an embodiment, the MOSFET channel width may be in a range from 0.25 µm to 0.3 µm.

In accordance with an exemplary embodiment of the present invention, a second source region 108 may be formed below or underneath the first sidewall body region 105 in each one of the plurality of vertical transistor cells in the epitaxial layer 102. The second source region 108 may be of the first conductivity type (e.g. N type) and may have a seventh dopant concentration (e.g. may also be referred to as a second source dopant concentration) so that the second source region 108 may serve/function as a source region of a junction field effect transistor ("JFET") cell integrated in each one of the plurality of vertical transistor cells, and thus may be referred to as being "highly doped" or "heavily doped" by those skilled in the art (e.g. illustrated as another N+ region in FIG. 1). In an embodiment, the second source region 108 may also be referred to as a JFET source region. In an embodiment, the seventh dopant concentration may be higher than the second dopant concentration of the epitaxial layer 102. In an embodiment, the seventh dopant concentration (e.g., the second source dopant concentration) may be at the same order of magnitude as or may be identical to the first dopant concentration (e.g. the drain dopant concentration) or the third dopant concentration (e.g., the first source dopant concentration). In an embodiment, the seventh dopant concentration may be in a range from $1e16\ cm^{-3}$ to $1e18\ cm^{-3}$. One of ordinary skill in the art would understand that, the semiconductor device 100 according to an exemplary embodiment of the present invention may comprise a MOSFET including a plurality of vertical MOSFET cells and a JFET including a corresponding plurality of JFET cells that are in one on one correspondence to the plurality of vertical MOSFET cells.

In accordance with an exemplary embodiment of the present invention, a second sidewall body region 109 of the second conductivity type (e.g. P type) may optionally be disposed below or underneath the second source region 108 in each one of the plurality of vertical transistor cells in the epitaxial layer 102. In the example of FIG. 1, the second sidewall body region 109 is illustratively shown as another P region other than the first sidewall body region 105 in each one of the plurality of vertical transistor cells and may have an eighth dopant concentration (e.g. may also be referred to as a second body dopant concentration). In an embodiment, the eighth dopant concentration (e.g. the second body dopant concentration) of the second sidewall body region 109 may be lower than the fifth dopant concentration (e.g. the body contact dopant concentration) of the body contact region 106. In an embodiment, the eighth dopant concentration may be at the same order of magnitude as or may be identical to the fourth dopant concentration (e.g. the first body dopant concentration). In an embodiment, the eighth dopant concentration (e.g. the second body dopant concentration) of the second sidewall body region 109 may be lower than the seventh dopant concentration (e.g. the second source dopant concentration) of the second source region 108. However, one of ordinary skill in the art would understand that the eighth dopant concentration (e.g. the second body dopant concentration) of the second sidewall body region 109 may be different from the fourth dopant concentration (e.g. the first body dopant concentration). In an embodiment, for example, the eighth dopant concentration may be in a range from $2e16\ cm^{-3}$ to $1e18\ cm^{-3}$.

In accordance with an exemplary embodiment of the present invention, in each one of the plurality of vertical transistor cells, the first source region 103, the lightly doped region 104 (if any is formed), the first sidewall body region 105, the second source region 108 and the second sidewall body region 109 (if any is formed) may be disposed at a first side (e.g. the right side in the example shown in FIG. 1) of the gate region 107, vertically arranged along a first sidewall (e.g. the right sidewall in the example shown in FIG. 1) of the gate region 107 and contact with the first sidewall of the gate region 107. In an exemplary embodiment, in each one of the plurality of vertical transistor cells, the second sidewall body region 109 (if any is formed) may extend from a bottom surface of the second source region 108 vertically down along the first sidewall (e.g. the right sidewall in the example shown in FIG. 1) of the gate region 107 until wrapping a first bottom corner (e.g. the right bottom corner in the example shown in FIG. 1) of the gate trench 1071.

Figure 11:
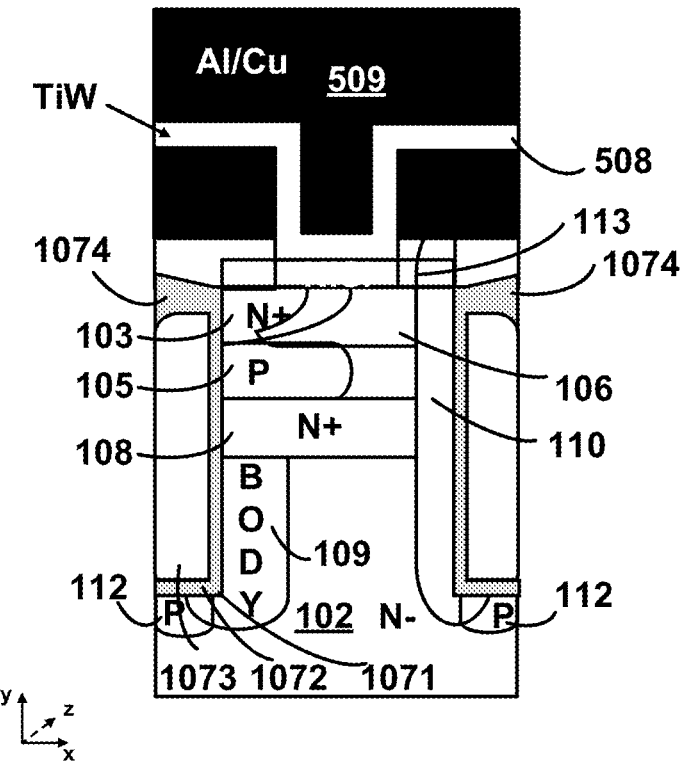
FIG. 11 illustrates a partial cross sectional view of a semiconductor device in accordance with an alternative embodiment of the present invention.
Figure 12:
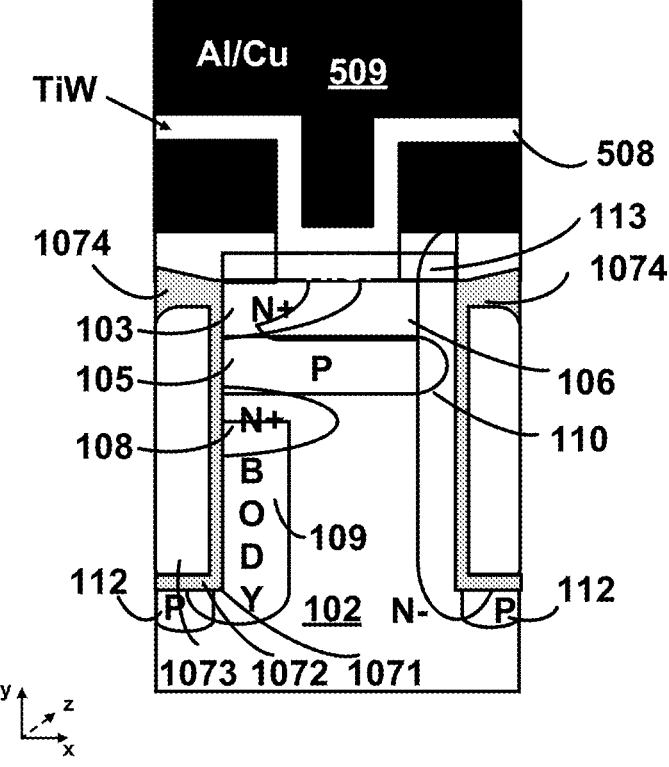
FIG. 12 illustrates a partial cross sectional view of a semiconductor device in accordance with an alternative embodiment of the present invention.
Figure 13:
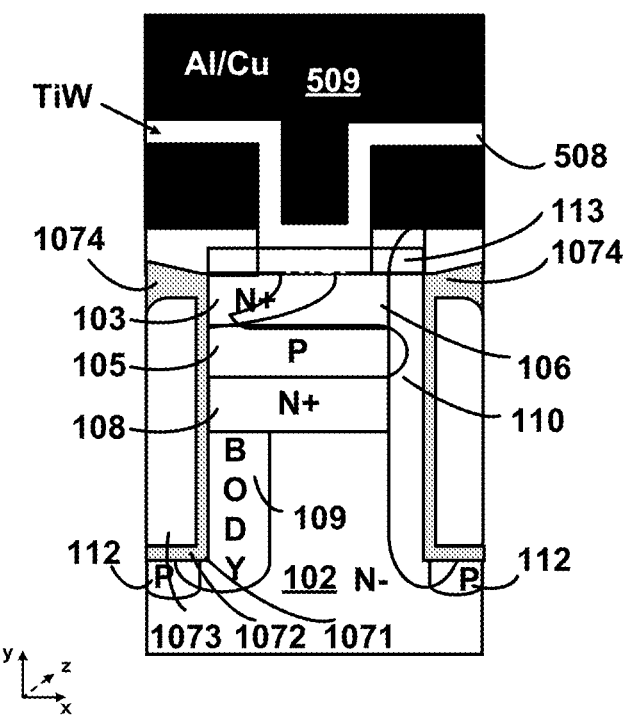
FIG. 13 illustrates a partial cross sectional view of a semiconductor device in accordance with still an alternative embodiment of the present invention.
Figure 14:
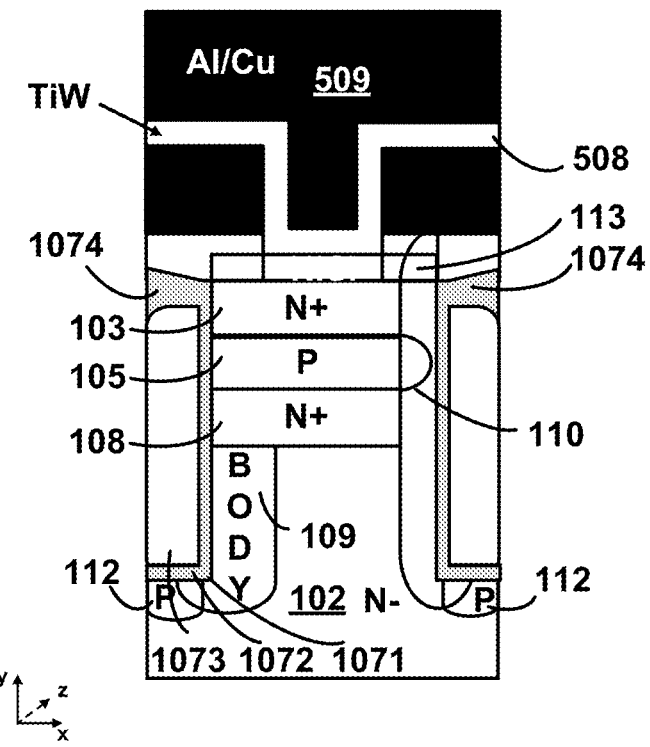
FIG. 14 illustrates a partial cross sectional view of a semiconductor device in accordance with still an alternative embodiment of the present invention.

In accordance with an exemplary embodiment of the present invention, a link region 110 of the second conductivity type (e.g. P type) may be disposed at the first side (e.g. the right side in the example of FIG. 1) of the first source region 103 in each one of the plurality of vertical transistor cells in the substrate (e.g. in the epitaxial layer 102 for the example of FIG. 1). In other words, in each one of the plurality of vertical transistor cells, the link region 110 and the gate region 107 may be respectively disposed at the first side of the first source region 103 and the second side of the first source region 103 opposite to each other. In accordance with an exemplary embodiment of the present invention, in each one of the plurality of vertical transistor cells, the link region 110 may have a portion extended vertically down into the substrate (e.g. into the epitaxial layer in the example of FIG. 1) deeper than the second source region 103. In accordance with an exemplary embodiment of the present invention, the link region 110 may have a substantial portion disposed lower/deeper than a bottom surface of the body contact region 106 in each one of the plurality of vertical transistor cells in the substrate (e.g. in the epitaxial layer 102 for the example of FIG. 1). In accordance with an exemplary embodiment of the present invention, the link region 110 may have a portion disposed below or underneath the body contact region 106 in each one of the plurality of vertical transistor cells in the substrate (e.g. in the epitaxial layer 102 for the example of FIG. 1). In an exemplary embodiment as shown in FIG. 1, in each one of the plurality of vertical transistor cells, the link region 110 may be separated by at least a portion of the substrate (e.g. a portion of the epitaxial layer 102 in the example of FIG. 1) from the first source region 103, the lightly doped region 104 (if any is formed), the first sidewall body region 105, the second source region 108 and the second sidewall body region 109 (if any is formed). However, one of ordinary skill in the art would understand that this is just to provide an example and not intended to be limiting, numerous variations from the structure of the semiconductor device 100 as shown in FIG. 1 may be obvious and are within the spirit and scope of the present disclosure. For instance, in an exemplary embodiment as shown in FIG. 11, in each one of the plurality of vertical transistor cells, the link region 110 may be separated by at least a portion of the substrate (e.g. a portion of the epitaxial layer 102) from the lightly doped region 104 (if any is formed), the first sidewall body region 105, and the second sidewall body region 109 (if any is formed) while the second source region 108 may not be separated from the link region 110. To provide another exemplary embodiment as shown in FIG. 12, in each one of the plurality of vertical transistor cells, the link region 110 may be separated by at least a portion of the substrate (e.g. a portion of the epitaxial layer 102) from the second source region 108 and the second sidewall body region 109 (if any is formed) while the lightly doped region 104 (if any is formed) and the first sidewall body region 105 may not be separated from the link region 110. To provide still another exemplary embodiment as shown in FIG. 13, in each one of the plurality of vertical transistor cells, the link region 110 may be separated by at least a portion of the substrate (e.g. a portion of the epitaxial layer 102) from the second sidewall body region 109 (if any is formed) while the lightly doped region 104 (if any is formed), the first sidewall body region 105, and the second source region 108 may not be separated from the link region 110. In an exemplary embodiment, in each one of the plurality of vertical transistor cells, the link region 110 may contact with the body contact region 106 (e.g. on top as shown in FIG. 1 or at side as shown in FIGS. 11-13) to be electrically coupled to the first source region 103. In an exemplary embodiment as shown in FIG. 14, the body contact region 106 may not be formed and the link region 110 may physically contact with the first source region 103 to electrically connect to the first source region 103. In an exemplary embodiment, in each one of the plurality of vertical transistor cells, the link region 110 may be disposed at a second side (e.g. the left side in the example shown in FIG. 1) of a gate region 107 of a neighboring vertical transistor cell. In an exemplary embodiment, in each one of the plurality of vertical transistor cells, the link region 110 may extend (e.g. from a bottom surface of the body contact region 106 or from the second surface of the substrate) vertically down along a second sidewall (e.g. the left sidewall in the example shown in FIG. 1) of the gate region 107 of the neighboring vertical transistor cell until wrapping a second bottom corner (e.g. the left bottom corner in the example shown in FIG. 1) of the gate trench 1071 of the neighboring vertical transistor cell, physically contacting with the body contact region 106 and physically contacting with the second sidewall of the gate region 107 of the neighboring vertical transistor cell. In an exemplary embodiment, the first side and the first sidewall of a single gate region 107 (or a single gate trench 1071) may be opposite to the second side and the second sidewall of that single gate region 107 (or that single gate trench 1071). In the example of FIG. 1, the link region 110 is illustratively shown as another P+ region other than the body contact region 106 in each one of the plurality of vertical transistor cells and may have a ninth dopant concentration (e.g. may also be referred to as a link dopant concentration). In an embodiment, the ninth dopant concentration (i.e. the link dopant concentration of the link region 110) may be higher than the first body dopant concentration (of the first sidewall body region 105) or the second body dopant concentration (of the second sidewall body region 109). In an embodiment, the ninth dopant concentration may be at the same order of magnitude as or may be identical to the fifth dopant concentration (e.g. the body contact dopant concentration of the body contact region 106). However, one of ordinary skill in the art would understand that the ninth dopant concentration of the link region 110 may be different from the fifth dopant concentration (e.g. the body contact dopant concentration). In an embodiment, the ninth dopant concentration (i.e. the link dopant concentration) of the link region 110 may be higher than the seventh dopant concentration (i.e. the second source dopant concentration) of the second source region 108. In an embodiment, for example, the ninth dopant concentration may be in a range from 1e18 cm$^{-3}$ to 5e19 cm$^{-3}$.

One of ordinary skill in the art would also understand that, when the vertical transistor 100 is turned off (i.e. in an off state or a blocking state), the link region 110 may advantageously help to deplete the portion of the substrate (e.g. a portion of the epitaxial layer 102 for the example of FIG. 1) which separates the link region 110 from the second sidewall body region 109 (if any is formed). That is to say, the link region 110 may advantageously help to at least deplete portions of the first conductivity type (e.g. N type in the example of FIG. 1) that are located between the gate region 107 and the link region 110 and below a bottom surface of the second source region 108. Herein after, in each one of the plurality of vertical transistor cells, "the portion of the substrate which separates the link region 110 from the second sidewall body region 109 (if any is formed)" or "portions of the first conductivity type between the gate region 107 and the link region 110 and below a bottom surface of the second source region 108" may be referred to as a "JFET channel region" for ease of description and understanding. Once the JFET channel region is depleted as a drain to source voltage (i.e. a voltage difference between the voltages applied on the drain region 101 and the first source region 103) VDS applied on the semiconductor device 100 increasing, the JFET pinches off. That is to say, a JFET source voltage at the second source region 108 reaches a pinch off threshold voltage Vp of the JFET now when the JFET is pinched off. After the JFET is pinched off, if the drain to source voltage VDS continues increasing, the JFET source voltage at the second source region 108 stops following the drain to source voltage VDS, and the pinchedoff JFET may shield the gate insulation layer 1072 (e.g. a gate oxide layer) from suffering from higher electric field stress and reduce holes injection into the gate insulation layer 1072, thereby protecting the gate insulation layer 1072 from premature rupture and improving a breakdown voltage or a high voltage tolerance performance of the semiconductor device 100. In embodiments where both the second sidewall body region 109 and the link region 110 are formed, both of the two regions 109 and 110 may advantageously deplete the JFET channel region (i.e. the portion of the epitaxial layer 102 located between them) from both side of the JFET channel region, and thus advantageously reducing the pinch off threshold voltage Vp of the JFET and further reducing or even eliminating holes injection into the gate insulation layer 1072, thereby further improving the breakdown voltage or the high voltage tolerance performance of the semiconductor device 100.

In accordance with an exemplary embodiment of the present invention, a JFET channel implantation region 111 of the first conductivity type (e.g. N type) may optionally be formed closely next to or in adjoining neighbor to the link region 110 in the JFET channel region in each one of the plurality of vertical transistor cells. In the exemplary embodiment illustrated in FIG. 1, the JFET channel implantation region 111 is illustratively shown to be formed along and in conformal with the link region 110 in the JFET channel region in each one of the plurality of vertical transistor cells. In an embodiment, the JFET channel implantation region 111 may be in contact with the body contact region 106 (if any is formed) above and with the link region 110 aside. In an exemplary embodiment, in each one of the plurality of vertical transistor cells, the JFET channel implantation region 111 may still be separated by at least a portion of the substrate (e.g. a portion of the epitaxial layer 102 in the example of FIG. 1) from the second sidewall body region 109 (if any is formed). In an exemplary embodiment, in each one of the plurality of vertical transistor cells, the link region 110 may be separated from the second sidewall body region 109 (if any is formed) at least by the JFET channel implantation region 111. In an exemplary embodiment, in each one of the plurality of vertical transistor cells, the JFET channel implantation region 111 may be separated by at least a portion of the substrate (e.g. a portion of the epitaxial layer 102) from the lightly doped region 104 (if any is formed), the first sidewall body region 105, and the second sidewall body region 109 (if any is formed). One of ordinary skill in the art would understand that for the examples with the JFET channel implantation region 111 formed in each one of the plurality of vertical transistor cells, "portions of the first conductivity type between the gate region 107 and the link region 110 and below a bottom surface of the second source region 108" or "JFET channel region" may include portions of the substrate and the JFET channel implantation region 111 that are located between the gate region 107 and the link region 110 and below a bottom surface of the second source region 108. The JFET channel implantation region 111 may have a tenth dopant concentration (e.g. may also be referred to as a JFET channel implantation concentration). In an embodiment, the tenth dopant concentration (e.g. the JFET channel implantation concentration) of the JFET channel implantation region 111 may be higher than the epitaxial dopant concentration of the epitaxial layer 102 and lower than the first source dopant concentration of the first source region 103. For instance, in an embodiment, the tenth dopant concentration may be in a range from $5\mathrm{e}16^{-3}$ to $5\mathrm{e}17\ \mathrm{cm}^{-3}$. The JFET channel implantation region 111 may advantageously allow easier and better control to the pinch off threshold voltage Vp of the JFET than it would be without the JFET channel implantation region 111. Those of ordinary skill in the art would understand that without the JFET channel implantation region 111, the pinch off threshold voltage Vp of the JFET might be highly dependent on a pitch width L1 of each vertical transistor cell. The pitch width L1 of a single vertical transistor cell among the plurality of vertical transistor cells may refer to a lateral distance between the middle lines of the gate trenches 1071 of every two immediately adjacent/neighboring vertical transistor cells.

In accordance with an exemplary embodiment of the present invention, a guard region 112 of the second conductivity type (e.g. P type) may optionally be formed below or under the bottom of each gate region 107 and contacting with the bottom of each gate region 107. For example as illustratively shown in FIG. 1, the guard region 112 (illustrated as a P region) is disposed below the bottom of the gate trench 1071 of each gate region 107. In an example, the guard region 112 may physically further contact with the second sidewall body region 109 (if any is formed) disposed at a first side (e.g. right side in the example of FIG. 1) of each gate region 107/gate trench 1071 and/or the link region 110 disposed at a second side (e.g. left side in the example of FIG. 1) of each gate region 107/gate trench 1071. The guard region 112 may advantageously protect the gate insulation layer 1072 from high electric field when high drain to source voltage VDS is applied and further improve the breakdown voltage or the high voltage tolerance performance of the semiconductor device 100. The guard region 112 may have an eleventh dopant concentration (e.g., may also be referred to as a guard region dopant concentration). The eleventh dopant concentration may be higher than the first body dopant concentration or the second body dopant concentration. In an embodiment, the eleventh dopant concentration may be at the same order of magnitude as the fifth dopant concentration (e.g. the body contact dopant concentration).

Figure 2A:
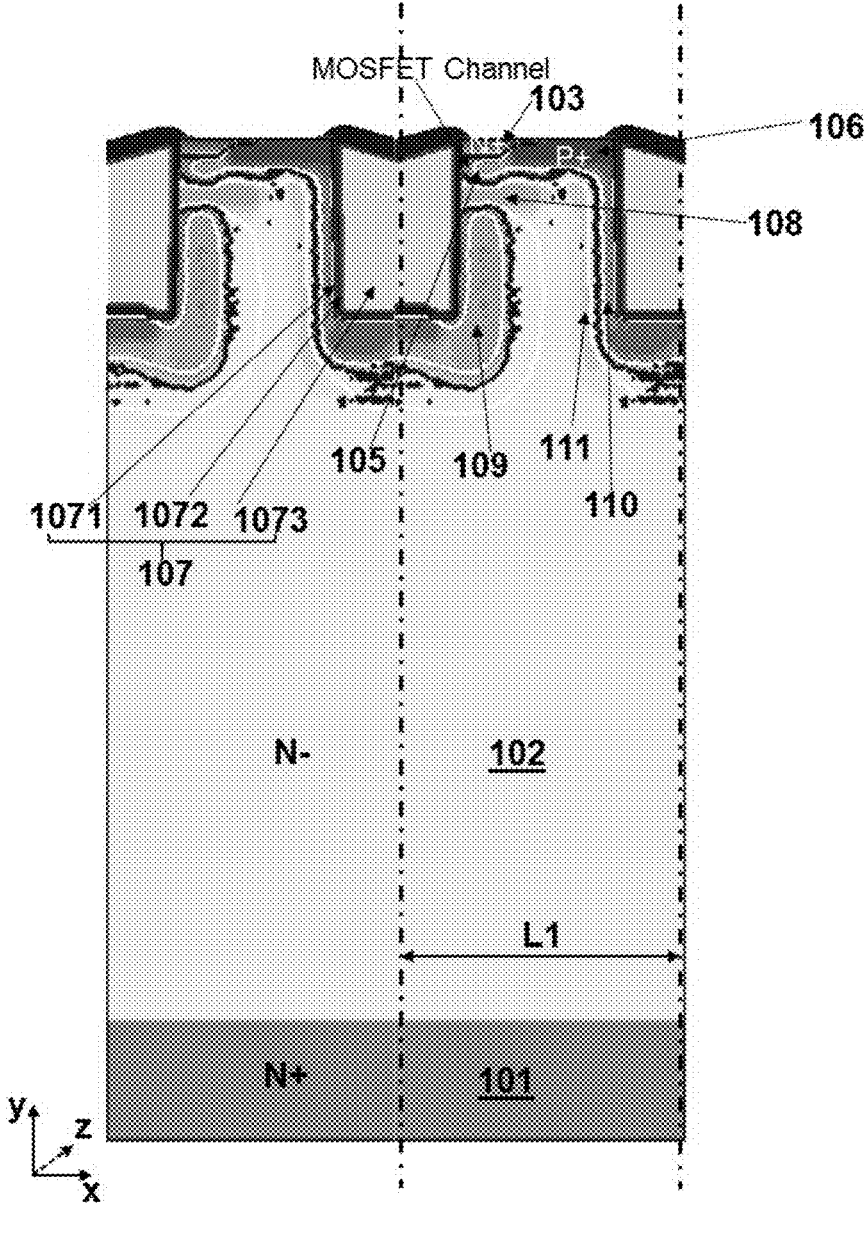
FIG. 2A illustrates a partial cross sectional view showing resistance distribution between MOSFET channel and JFET in an ON state or conducting state of the semiconductor device 100 under simulation.
Figure 2B:
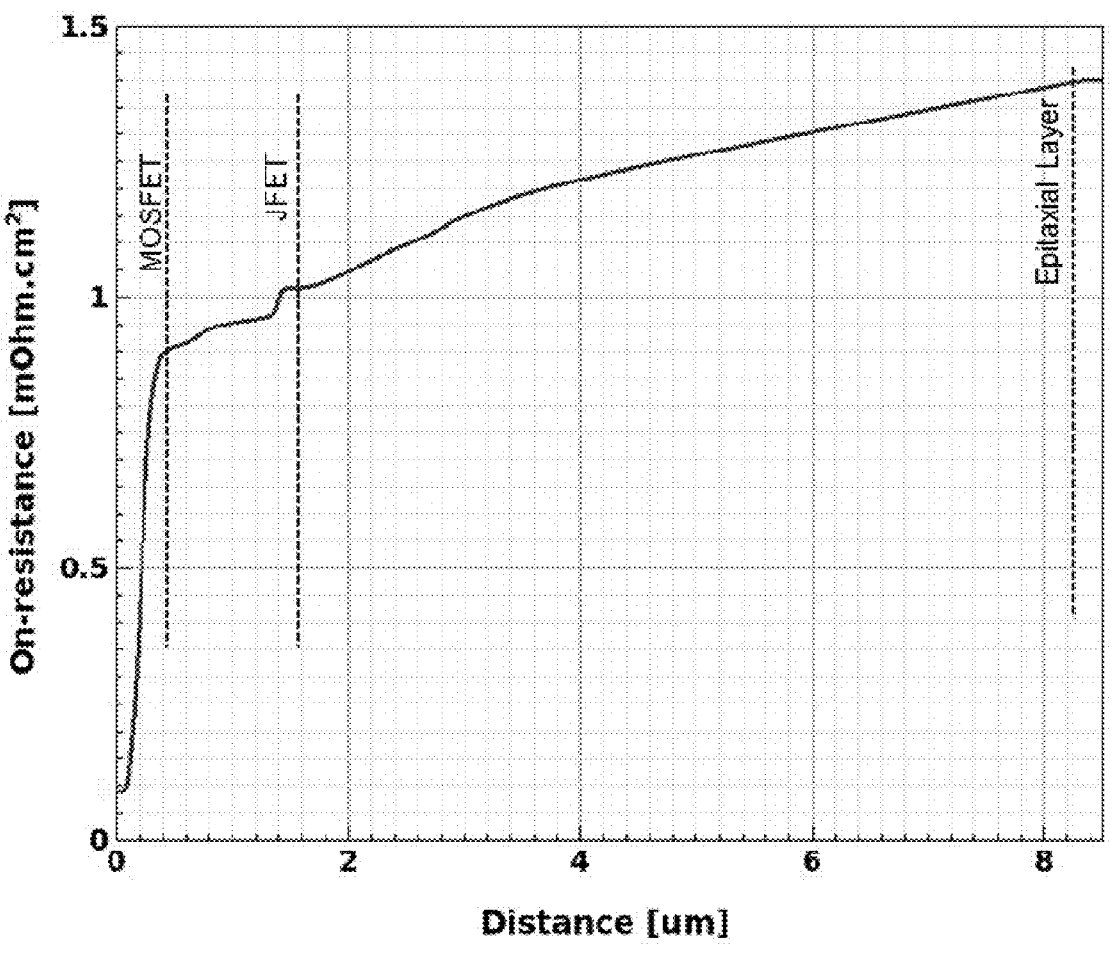
FIG. 2B illustrates a waveform diagram showing a plot of specific on-resistance versus a distance from the second surface of the substrate (e.g. the top surface S1 of the epitaxial layer 102 for the example of FIG. 1) for the semiconductor device 100 in an ON state or conducting state under simulation for a given breakdown voltage rating of 750V.

FIG. 2A illustrates a partial cross sectional view showing resistance distribution between MOSFET channel and JFET in an ON state or conducting state of the semiconductor device 100 under simulation. In this example, simulation is performed with the exemplary parameters pitch width L1=2.5 μm, gate trench width w1=1.2 μm, gate insulation thickness T1=65 nm, a gate to source voltage VG=15V and a drain to source voltage VDS=1V applied to the semiconductor device 100. Simulation result gives that the JFET may have a specific on resistance $R_J*A_J$ of around 1 $\mathrm{m\Omega*cm^2}$ while the trench MOSFET may have a specific on resistance $R_M*A_M$ of around 0.5 $\mathrm{m\Omega*cm^2}$, and thus the semiconductor device 100 should have a total specific on resistance Ron*A lower than 2 $\mathrm{m\Omega*cm^2}$ in this example. One of ordinary skill in the art should understand that this is just to provide a specific example, but not intended to be limiting. The specific on resistance $R_J*A_J$ of the JFET, the specific on resistance $R_M*A_M$ of the MOSFET and the total specific on resistance Ron*A of the semiconductor device 100 may vary if values of the parameters such as pitch width L1, gate trench width w1, gate insulation thickness T1, gate to source voltage VG and drain to source voltage VDS etc. change. For instance, in an alternative embodiment, the JFET may have a specific on resistance $R_J*A_J$ in a range from 0.1 $\mathrm{m\Omega*cm^2}$ to 1 $\mathrm{m\Omega*cm^2}$, the MOSFET may have a specific on resistance $R_M*A_M$ in a range from 0.3 $\mathrm{m\Omega*cm^2}$ to 1.2 $\mathrm{m\Omega*cm^2}$, and the semiconductor device 100 may have a total specific on resistance Ron*A lower than 2.2 $\mathrm{m\Omega*cm^2}$. In an exemplary embodiment, for a given breakdown voltage rating of 750V, the semiconductor device 100 in accordance with various embodiments of the present invention may have a total specific on resistance Ron*A in a range from 1.5 m$\Omega$*cm$^2$ to 1.8 m$\Omega$*cm$^2$. For instance, FIG. 2B illustrates a waveform diagram showing a plot of specific on-resistance versus a distance from the second surface of the substrate (e.g. the top surface S1 of the epitaxial layer 102 for the example of FIG. 1) for a semiconductor device 100 in an ON state or conducting state under simulation for a given breakdown voltage rating of 750V. Distribution of the specific on resistance R$_J$*A$_J$ of the JFET, the specific on resistance R$_M$*A$_M$ of the MOSFET and the total specific on resistance Ron*A of the semiconductor device 100 under test can easily be seen from the plot of FIG. 2B.

Figure 3A:
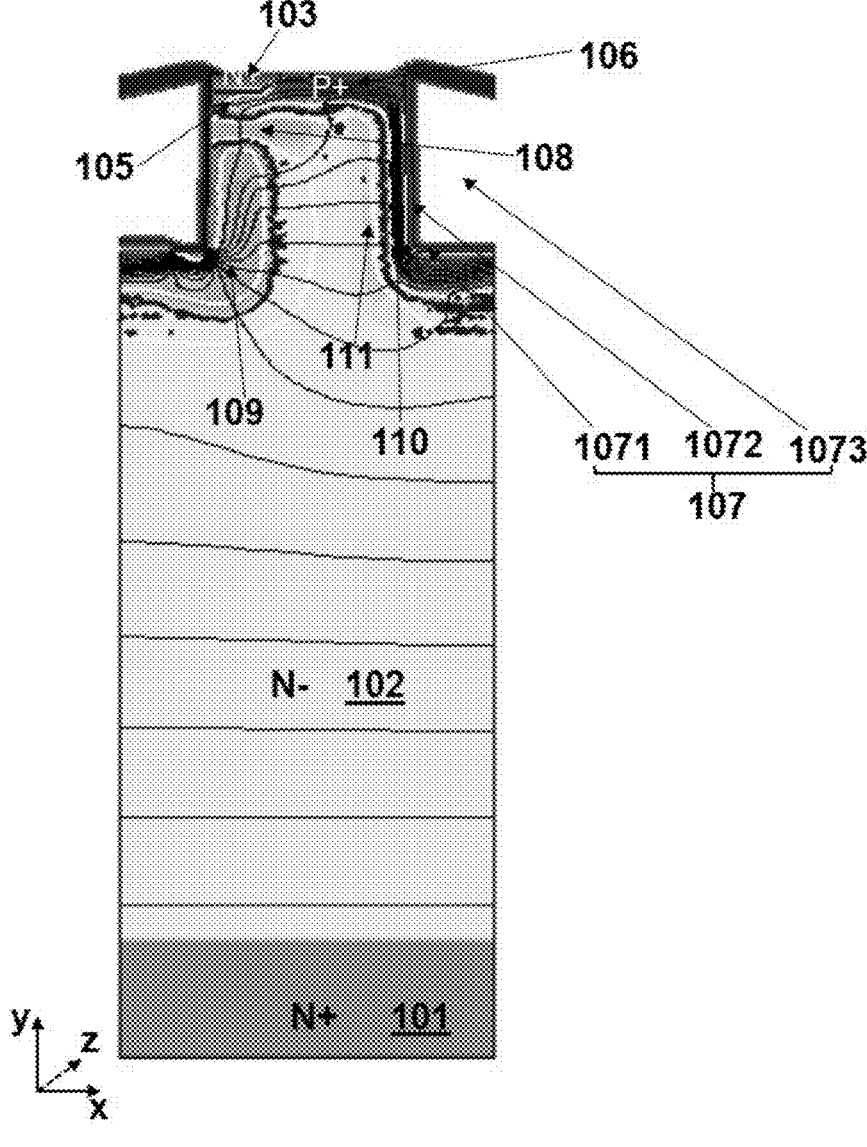
FIG. 3A illustrates a partial cross sectional view showing distribution of equipotential lines in the semiconductor device 100 in an ON state or conducting state under simulation.

FIG. 3A illustrates a partial cross sectional view showing distribution of equipotential lines in the semiconductor device 100 in an ON state or conducting state under simulation with the same exemplary parameters as described above with reference to FIG. 2A.

Figure 3B:
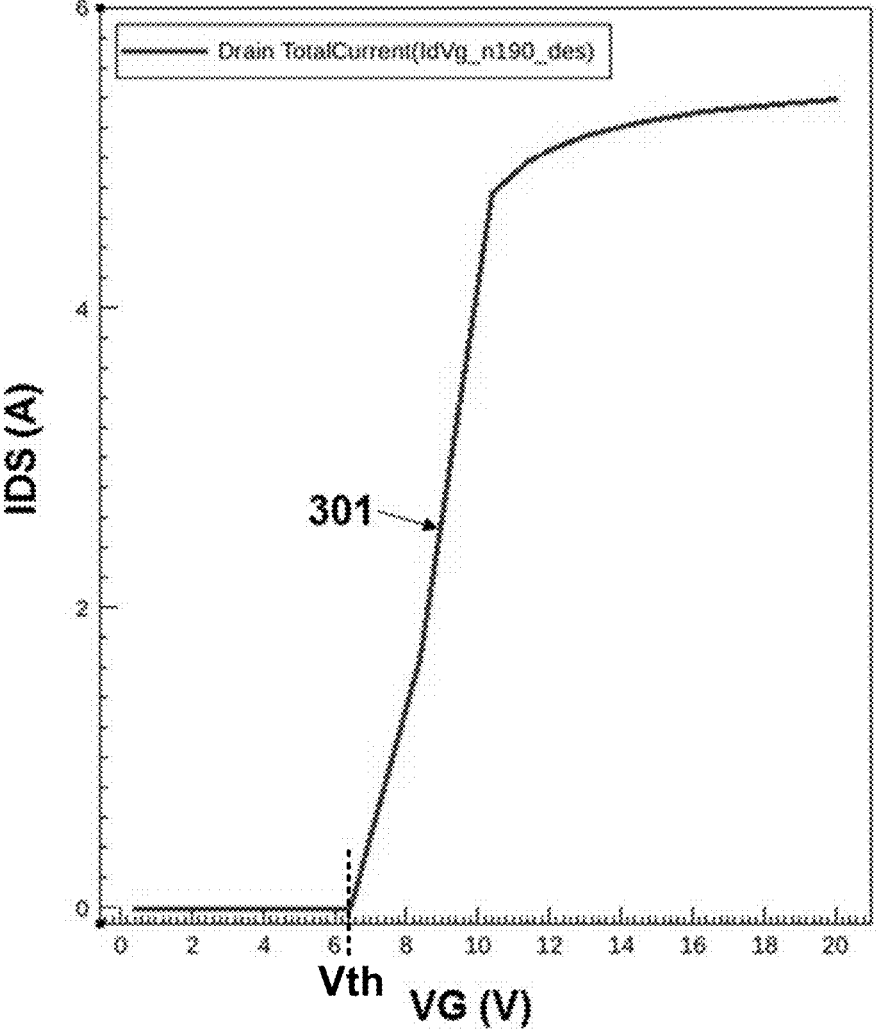
FIG. 3B illustrates an electrical characteristic curve 301 showing a drain to source current IDS flowing from the drain region 101 to the source region 103 versus the gate to source voltage VG of the semiconductor device 100 in an ON state or conducting state under simulation.

FIG. 3B illustrates an electrical characteristic curve 301 showing a drain to source current IDS flowing from the drain region 101 to the source region 103 versus the gate to source voltage VG of the semiconductor device 100 in an ON state or conducting state under simulation with the same exemplary parameters as described above with reference to FIG. 2 except that the gate to source voltage VG is varying. It can be seen from FIG. 3B that the semiconductor device 100 may be turned on when the gate to source voltage VG reaches a turn-on threshold voltage Vth that is about 6.4V in this example.

Figure 4A:
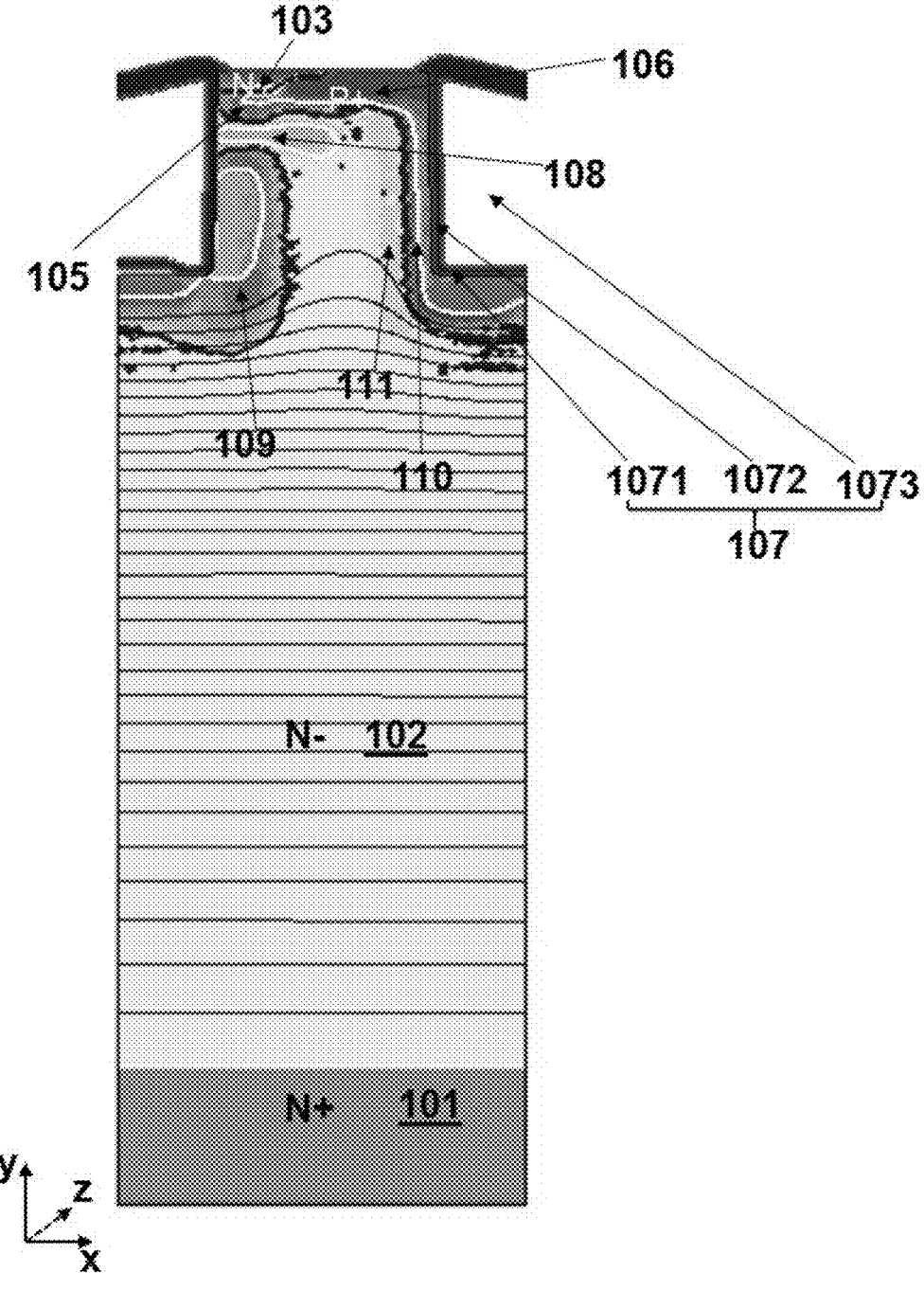
FIG. 4A illustrates a partial cross sectional view showing equipotential lines and depletion region boundaries in an OFF state of the semiconductor device 100 under simulation.

FIG. 4A illustrates a partial cross sectional view showing equipotential lines and depletion region boundaries in an OFF state of the semiconductor device 100 under simulation. This shows that the second source region 108 remains undepleted in the OFF state with the drain to source voltage VDS continuously increasing, hence the gate insulation layer 1072 should be well protected from high electric field.

Figure 4B:
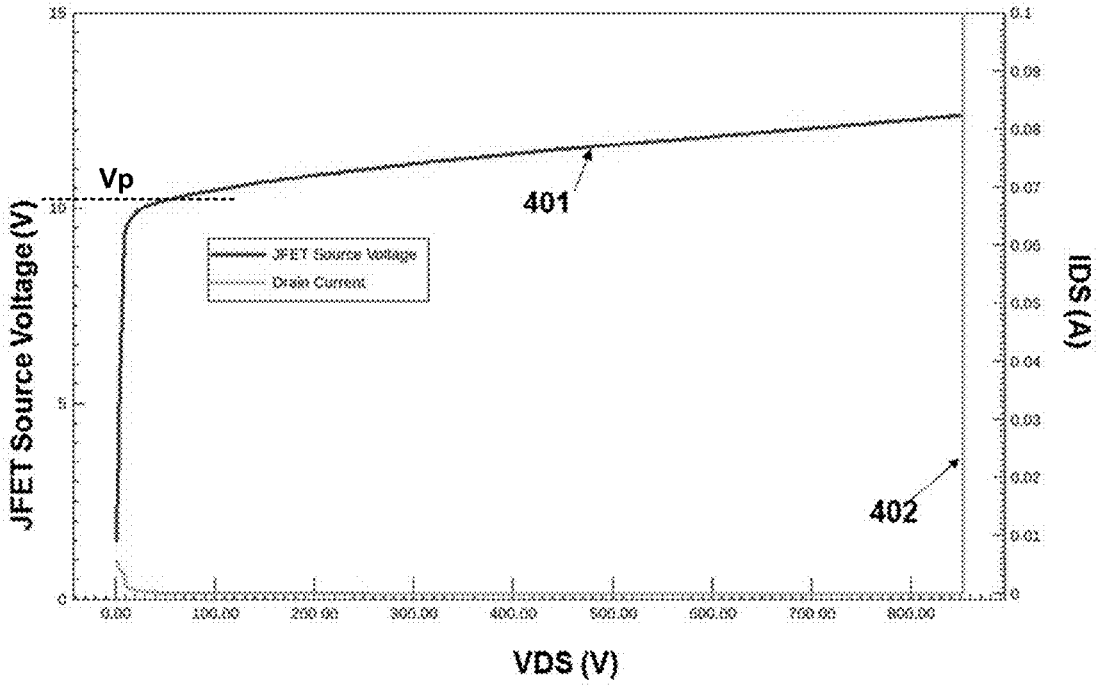
FIG. 4B illustrates a curve 401 showing a JFET source voltage at the JFET source region 108 versus a drain to source voltage VDS of the semiconductor device 100 and a curve 402 showing a drain to source current IDS versus the drain to source voltage VDS of the semiconductor device 100 in an OFF state or blocking state with under simulation.

FIG. 4B illustrates a curve 401 showing a JFET source voltage at the JFET source region 108 versus a drain to source voltage VDS of the semiconductor device 100 and a curve 402 showing a drain to source current IDS versus the drain to source voltage VDS of the semiconductor device 100 in an OFF state or blocking state with exemplary parameters under simulation. In this example, simulation is performed with the exemplary parameters pitch width L1=2.5 $\mu$m, gate trench width w1=1.2 $\mu$m, gate insulation thickness T1=65 nm, a gate to source voltage VG<Vth and a drain to source voltage VDS varying from 0V to higher than 850V applied to the semiconductor device 100. It can be seen from FIG. 4B that with the drain to source voltage VDS continuously increasing, the JFET source voltage increases to a maximum of about 10V to 12V in this example and stops increasing with the VDS, which means that the JFET source voltage reaches the pinch-off voltage Vp and the JFET is pinched off, preventing the gate insulation layer 1072 from suffering higher electric field and improving a breakdown voltage or a high voltage tolerance performance of the semiconductor device 100. It can be seen from the curve 402 that the semiconductor device 100 finally breaks down when the drain to source voltage VDS exceeds about 830V in this particular example.

Figure 5A:
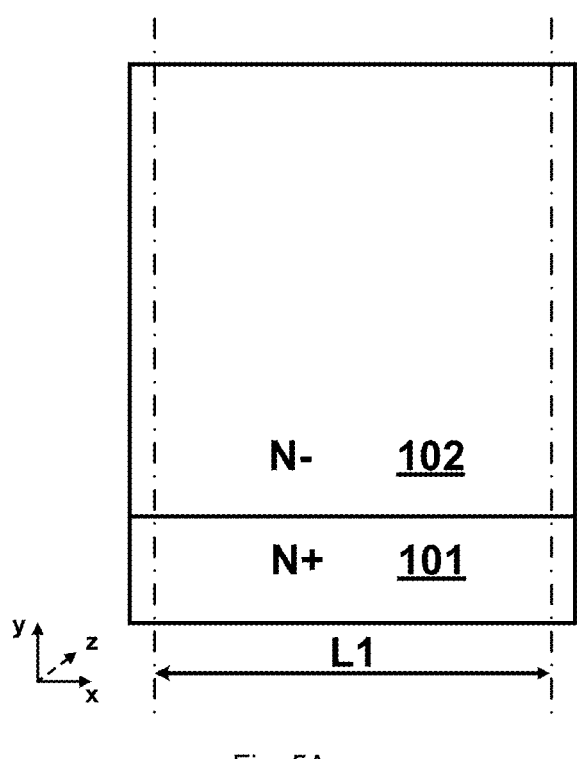
FIG. 5A to FIG. 5T illustrate partial cross sectional views of some process stages of a method for manufacturing a semiconductor device (for example, the semiconductor device 100 of FIG. 1) in accordance with an embodiment of the present invention.
Figure 5B:
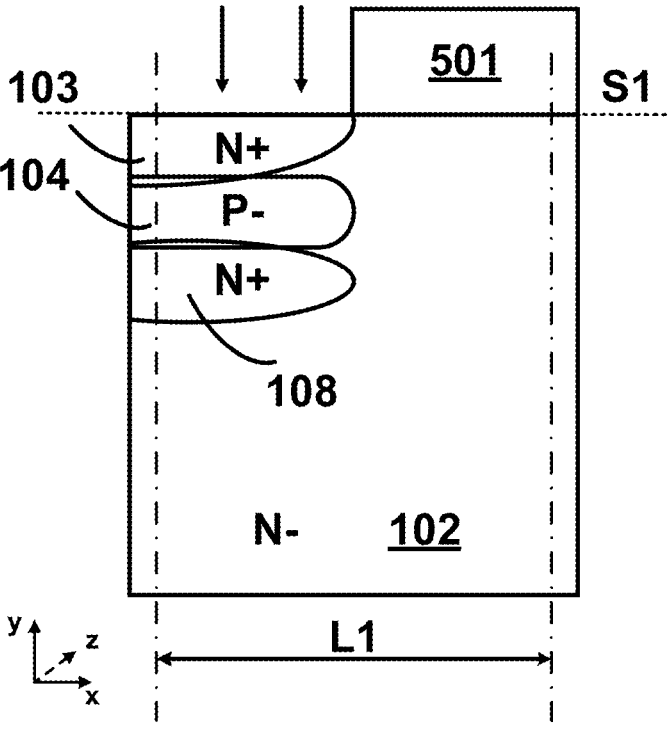
Figure 5C:
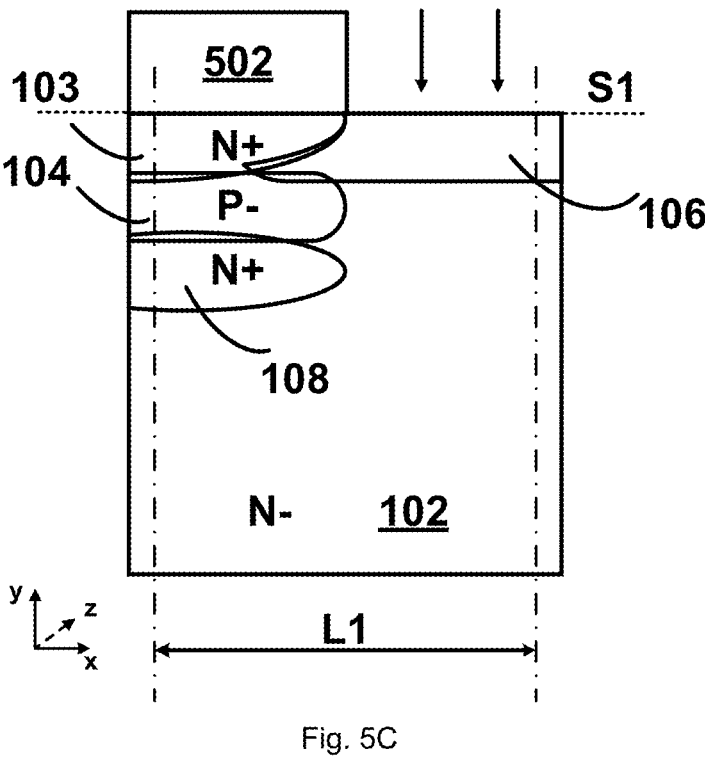
Figure 5D:
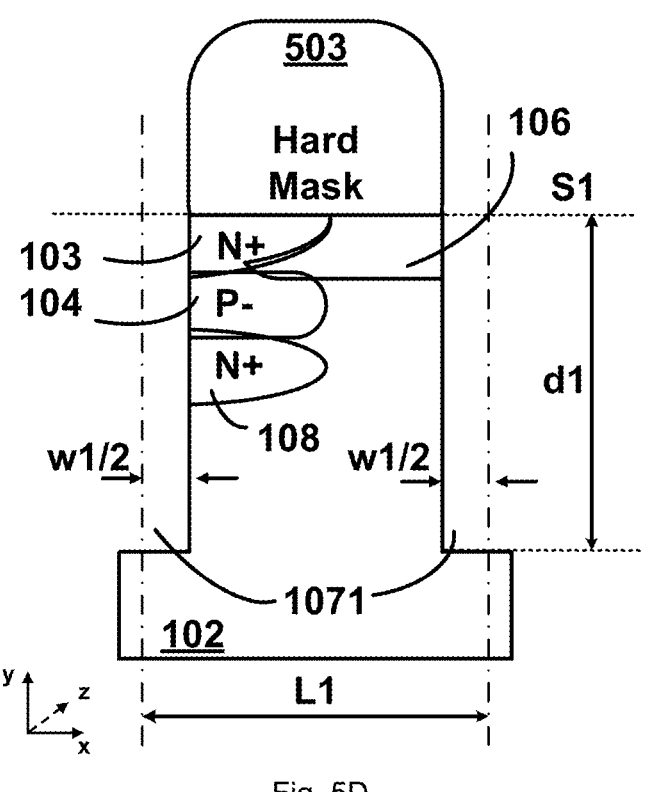
Figures 5E, 5F:
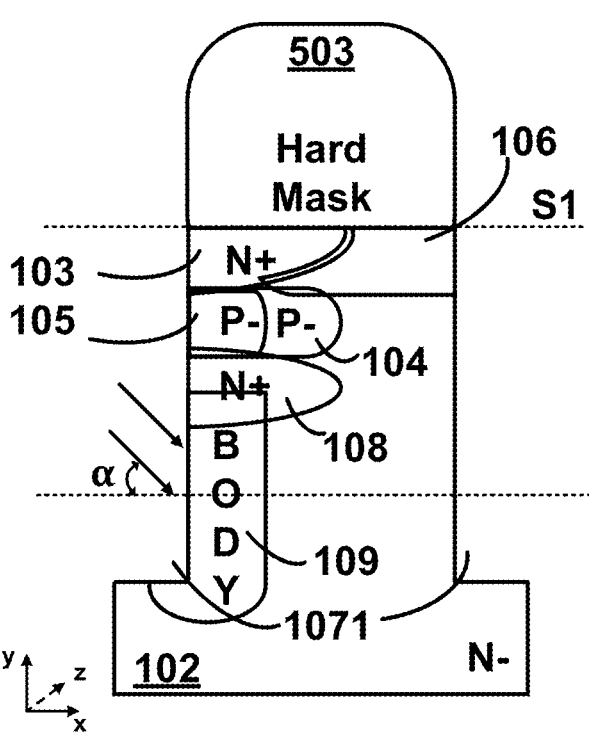
Figure 5G:
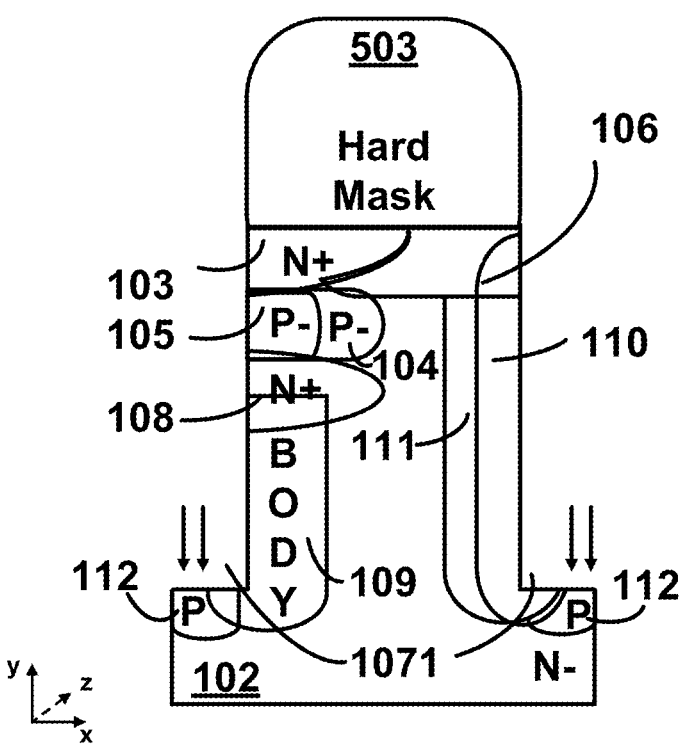
Figure 5H:
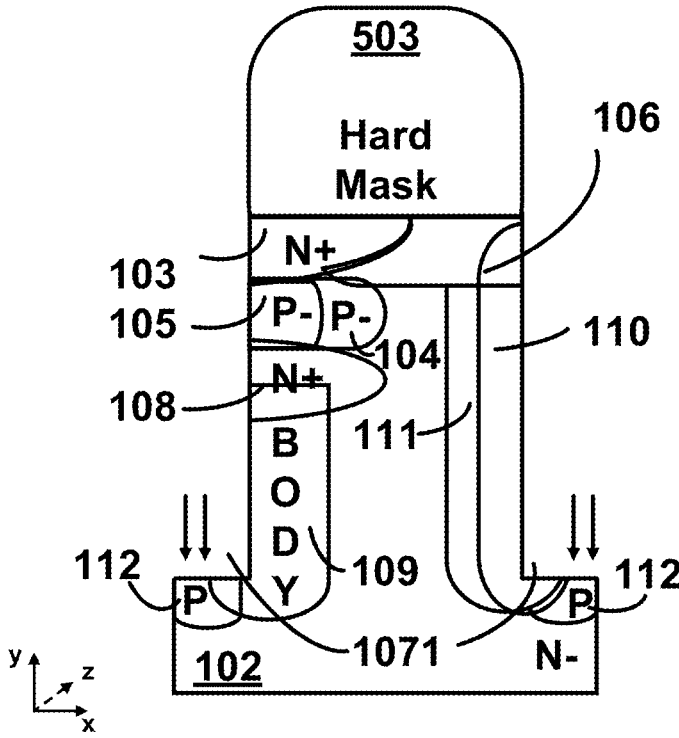
Figure 5I:
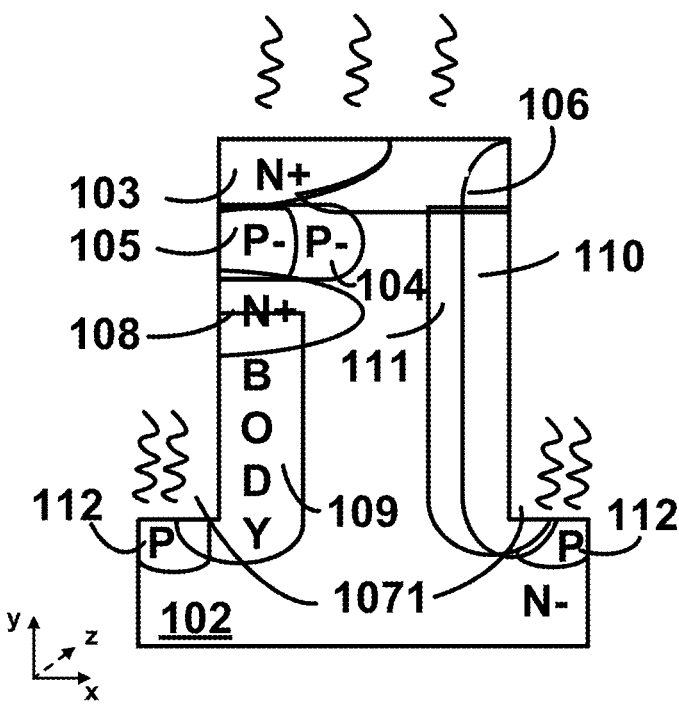
Figure 5J:
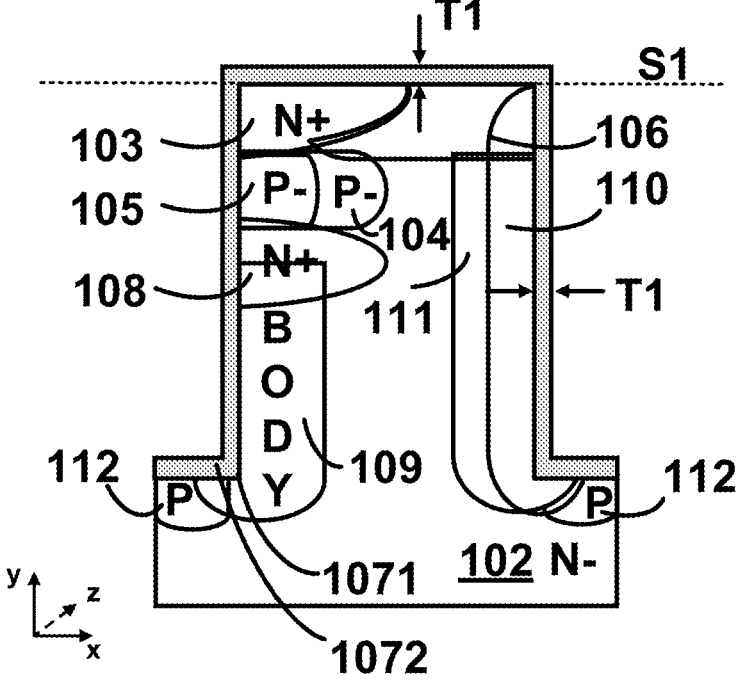
Figure 5K:
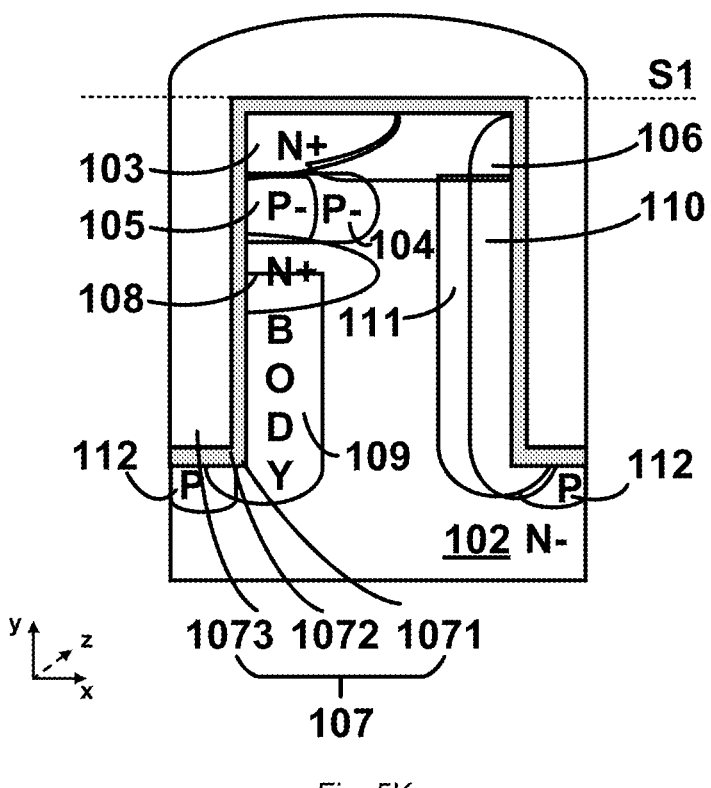
Figure 5L:
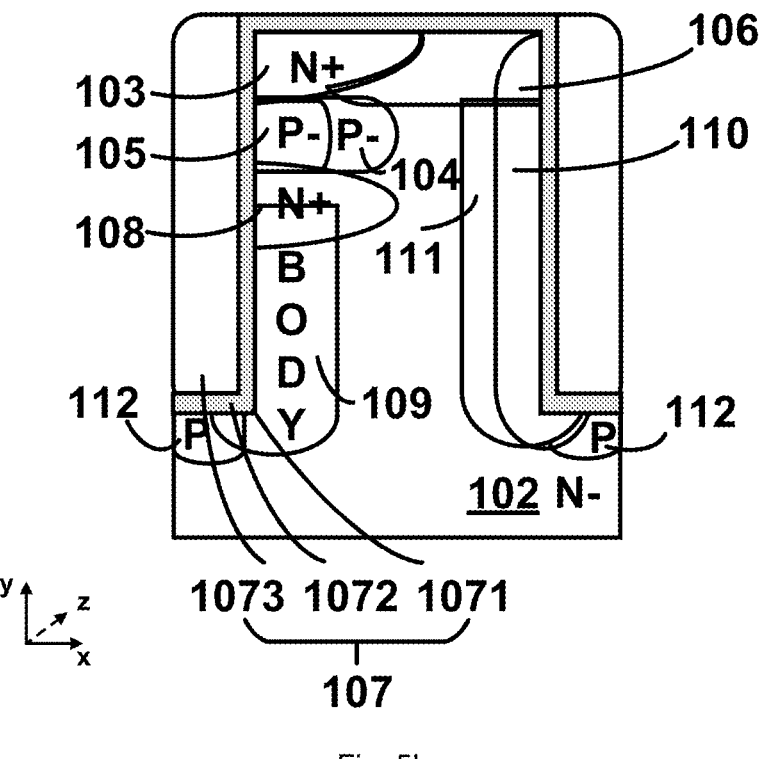
Figure 5M:
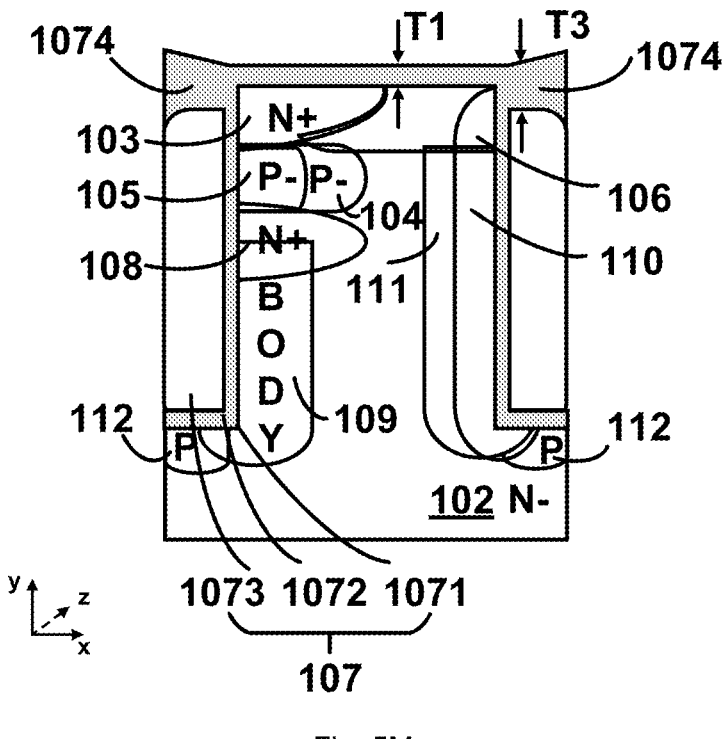
Figure 5N:
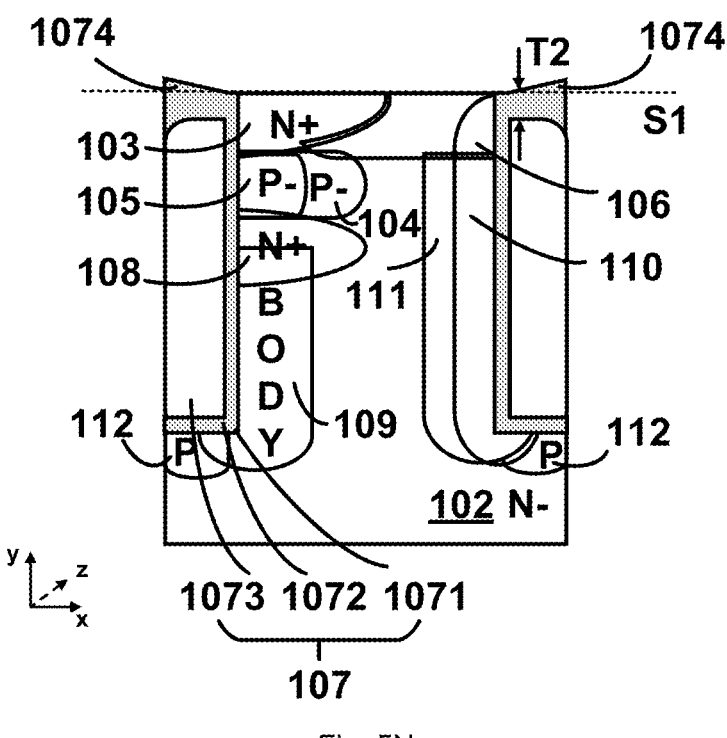
Figure 5O:
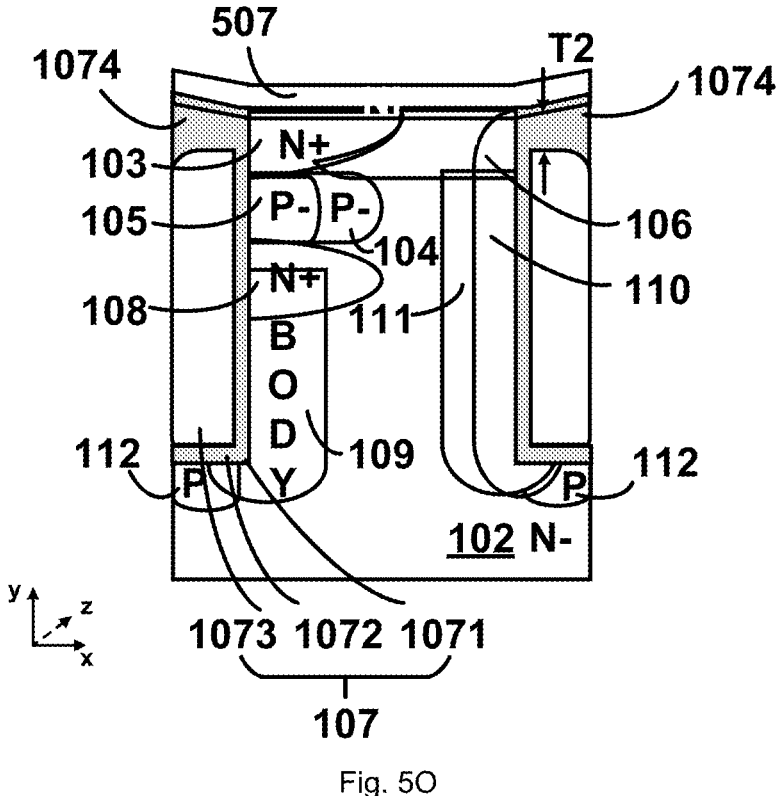
Figure 5P:
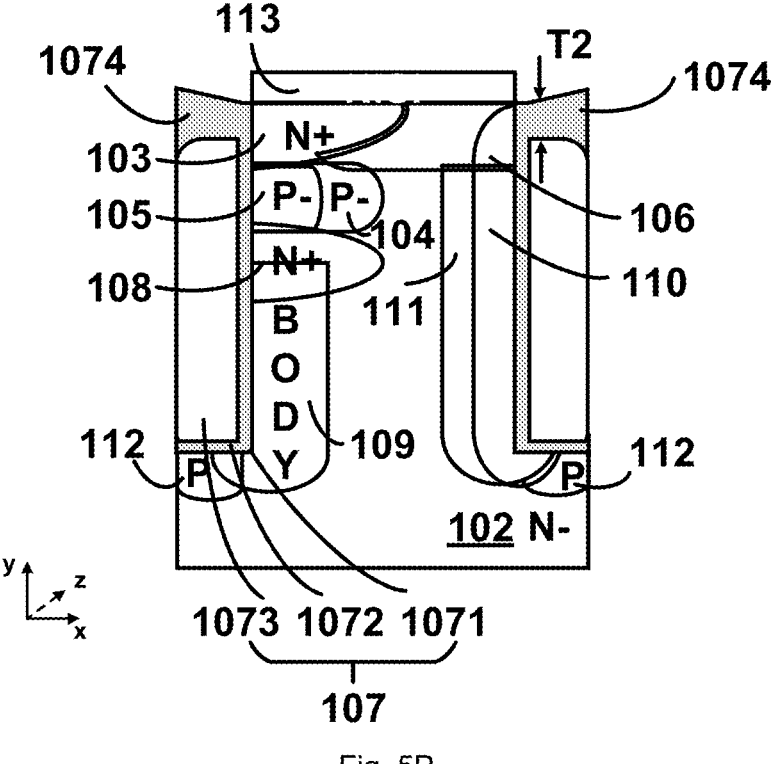
Figure 5Q:
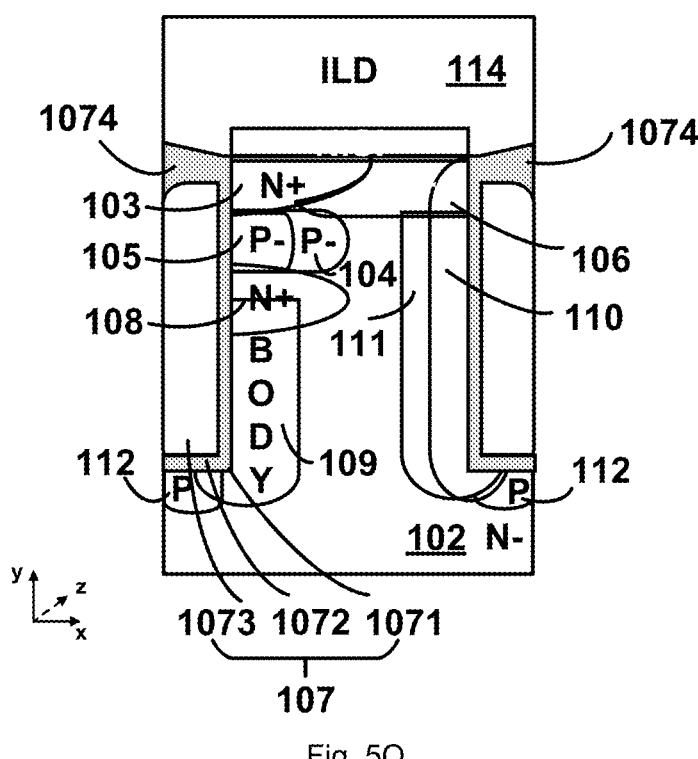
Figure 5R:
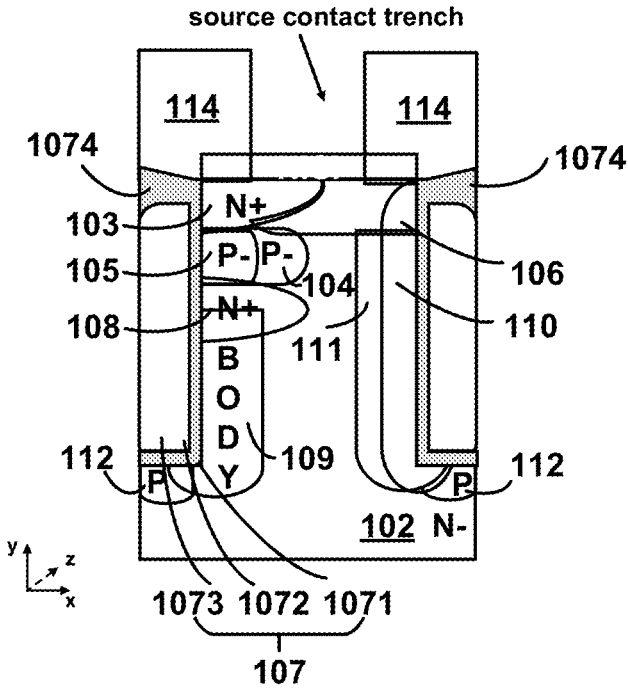
Figure 5S:
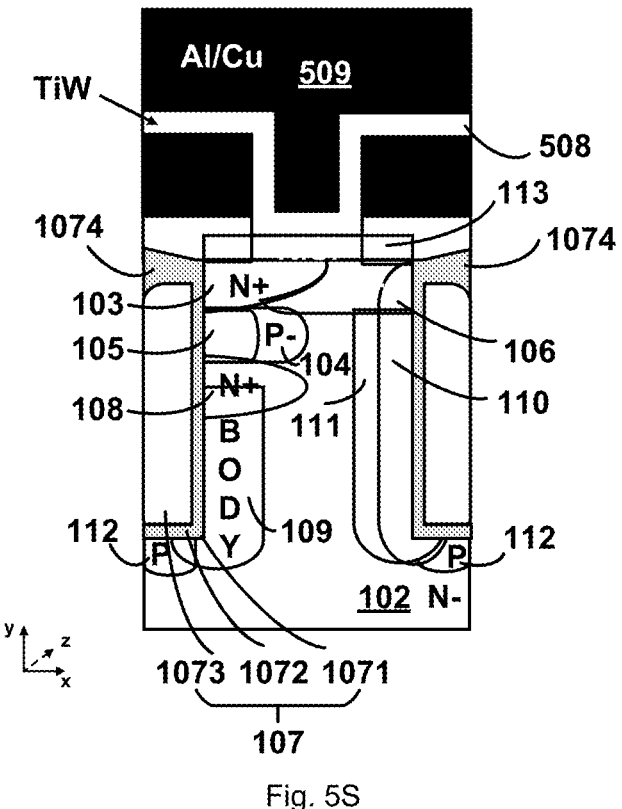
Figure 5T:
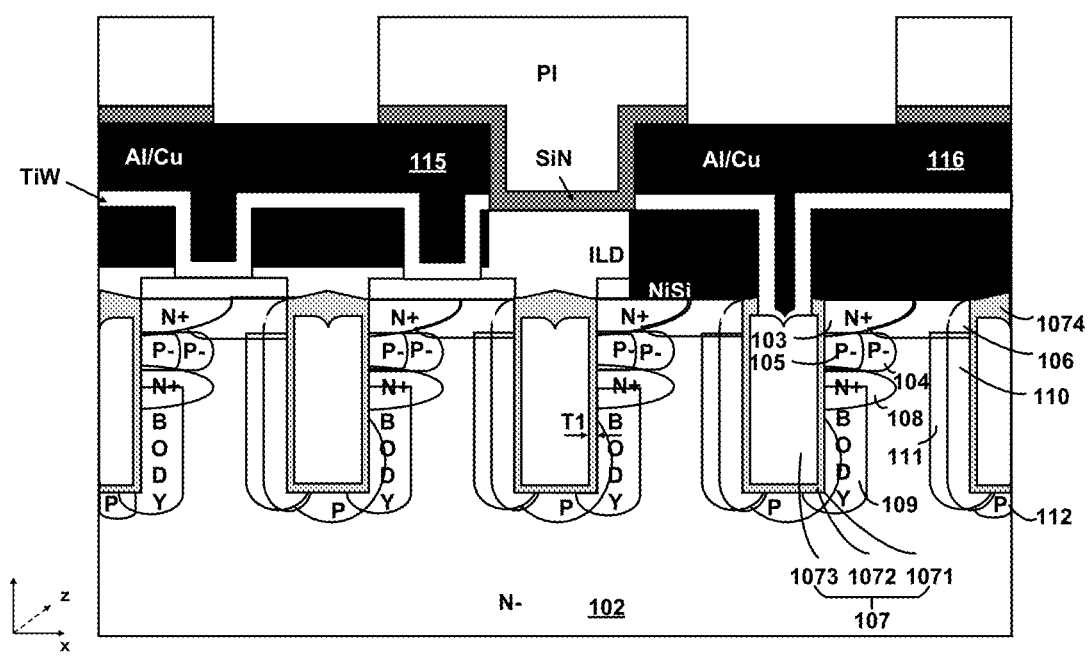

FIG. 5A to FIG. 5T illustrate partial cross sectional views of some process stages of a method for manufacturing a semiconductor device (for example, the semiconductor device 100 mentioned in the above described embodiments with reference to FIG. 1) in accordance with an embodiment of the present invention. The cross-sectional views in FIG. 5A to FIG. 5T may be considered as illustrated out in a 3 dimensional coordinate system having the x axis, y axis and z axis perpendicular to one another. It may be understood that the illustrative cross sectional views are inspected from/taken from a cutting plane parallel to the x-y plane defined by the x and y axis. It may be understood that each one of the cross-sectional views may be an illustrative cross-sectional image showing a portion where a single vertical transistor cell of the semiconductor device 100 is designated to be formed at a certain process stage described in conjunction with that cross-sectional view. One of ordinary skill in the art would understand that the semiconductor device 100 may comprise a plurality of (i.e. one or more) vertical transistor cells, each identical to the single vertical transistor cell exemplarily described and illustrated out here. In an embodiment, each vertical transistor cell of the plurality of (i.e. one or more) vertical transistor cells of the semiconductor device 100 may have a predetermined cell pitch width L1. While a limited portion encompassing a single vertical transistor cell of the semiconductor device 100 is shown, it will be understood that the below-described processes are performed across an entire portion of a substrate (e.g. a substrate including a semiconductor layer 101 and an epitaxial layer 102 as shown in FIG. 1) to produce all of the plurality of vertical transistor cells of the semiconductor device 100.

Referring to FIG. 5A, a substrate of a first conductivity type having a drain region (e.g. illustrated by an N+ layer in FIG. 1 and FIG. 5A) doped at least adjacent a first surface (e.g. bottom surface) of the substrate may be prepared. In an example, the substrate may include an epitaxial layer 102 which may be formed on a semiconductor layer (e.g. the semiconductor layer 101 as shown in FIG. 1) of a first conductivity type (e.g. N type). In an example, the semiconductor layer 101 may be doped to have a first dopant concentration (e.g. may also be referred to as a drain dopant concentration) at least adjacent a first surface (e.g. the bottom surface of the semiconductor layer 101 in the example of FIG. 1) of the semiconductor layer 101 so that the drain region of the semiconductor device 100 may be formed. The epitaxial layer 102 may be formed of semiconductor materials identical to those of the semiconductor layer 101 and may be doped with dopants of the first conductivity to have a second dopant concentration (e.g. the epitaxial dopant concentration). The second dopant concentration may be lower than the first dopant concentration (e.g. illustrated by an N– layer in FIG. 1 and FIG. 5A). For instance, in an embodiment, the second dopant concentration may range from 1e14 cm$^{-3}$ to 1e18 cm$^{-3}$.

In subsequence, referring to FIG. 5B, a first source region (e.g. the MOSFET source region 103), a lightly doped region (e.g. the lightly doped region 104) and a second source region (e.g. the JFET source region 108) may be formed in the substrate (e.g. in the epitaxial layer 102) by implantation for each one of the plurality of vertical transistor cells of the semiconductor device 100 under the shield of a patterned first implantation mask 501. The patterned first implantation mask 501 may be formed on the second surface of the substrate (e.g. on the top surface S1 of the epitaxial layer 102 in the example of FIG. 5B) and be patterned to expose pre-defined areas on the second surface of the substrate (e.g. the top surface S1 of the epitaxial layer 102) where dopants to form the JFET source region 108, the lightly doped region 104 and the MOSFET source region 103 of each one of the plurality of vertical transistor cells of the semiconductor device 100 would be implanted in. The patterned first implantation mask 501 may be removed after the implantation processes for forming the JFET source regions 108, the lightly doped regions 104 and the MOSFET source regions 103 are completed. For each one of the plurality of vertical transistor cells, the first source region 103 may be formed adjacent a second surface (e.g. top surface) of the substrate opposite to the first surface, and the second source region 108 may be formed below the first source region 103 and separated from the first source region 103. For each one of the plurality of vertical transistor cells, the lightly doped region 104 may be formed directly under the first source region 103 to separate the first source region 103 and the second source region 108. In an exemplary embodiment, the lightly doped regions 104 of the plurality of vertical transistor cells may be optional and may not be formed and thus implantation process for forming the lightly doped regions 104 may be saved. Conductivity type (or dopant type) and dopant concentration of the JFET source region 108, the lightly doped region 104 (if any is formed) and the MOSFET source region 103 have been described with reference to FIG. 1 and will not be repeated here for simplicity.

Referring to FIG. 5C, a body contact region (e.g. the body contact region 106) may be formed in the substrate (e.g. in the epitaxial layer 102) by implantation for each one of the plurality of vertical transistor cells of the semiconductor device 100 under the shield of a patterned second implantation mask 502. The patterned second implantation mask 502 may be formed on the second surface of the substrate (e.g. on the top surface S1 of the epitaxial layer 102 in the example of FIG. 5C) and be patterned to expose pre-defined areas on the second surface of the substrate (e.g. the top surface S1 of the epitaxial layer 102) where dopants to form the body contact region 106 of each one of the plurality of vertical transistor cells of the semiconductor device 100 would be implanted in. For each one of the plurality of vertical transistor cells, the body contact region 106 may be formed adjacent the second surface (e.g. top surface) of the substrate and closely next to or in adjoining neighbor to the first source region 103 at a first side (e.g. right side in the example of FIG. 5C) of the first source region 103. The patterned second implantation mask 502 may be removed after the implantation process for forming the body contact regions 106 of the plurality of vertical transistor cells is completed. Conductivity type (or dopant type) and dopant concentration of the body contact region 106 have been described with reference to FIG. 1 and will not be repeated here for simplicity. In an exemplary embodiment, the body contact regions 106 of the plurality of vertical transistor cells may not be formed and thus the process for forming the body contact regions 106 described with reference to FIG. 5C may be saved.

Referring to FIG. 5D, a gate trench 1071 of a gate region (e.g. like the gate region 107 shown in FIG. 1) for each one of the plurality of vertical transistor cells of the semiconductor device 100 may be formed in the substrate (e.g. in the epitaxial layer 102 in the example of FIG. 5D) under the shield of a patterned trench-forming mask 503. The patterned trench-forming mask 503 may be formed on the second surface of the substrate (e.g. on the top surface S1 of the epitaxial layer 102 in the example of FIG. 5D) and be patterned to expose pre-defined areas on the second surface of the substrate (e.g. the top surface S1 of the epitaxial layer 102) where gate trenches 1071 of the gate regions 107 for the plurality of vertical transistor cells of the semiconductor device 100 would be opened. In the example of FIG. 5D, the gate trenches 1071 may be opened in the epitaxial layer 102 such that each one of the gate trenches 1071 is disposed closely next to or in adjoining neighbor to a corresponding one of the MOSFET source regions 103 and being disposed at a second side (e.g. left side in the example of FIG. 5D) of the corresponding one MOSFET source region 103. Each one of the gate trenches 1071 may be opened (e.g. by etching) from the top surface S1 of the epitaxial layer 102 under the shield of the patterned trench-forming mask 503 and extended vertically into the epitaxial layer 102 with a predetermined gate trench depth d1 and a predetermined gate trench width w1. Locations of the gate regions 107 or the gate trenches 1071 of the gate regions 107 of the plurality of vertical transistor cells may be better understood further in conjunction with the illustration of FIG. 1. One of ordinary skill in the art would understand that every two neighboring vertical transistor cells of the plurality of vertical transistor cells may share a single gate region 107 (e.g. disposed in a single gate trench 1071). In the example of FIG. 5D, a portion of the semiconductor device encompassing a single vertical transistor cell of the plurality of vertical transistor cells is illustrated out. The single vertical transistor cell shown in the example of FIG. 5D shares its gate trench 1071 of its gate region 107 (half of which is exemplarily illustrated out on the left side) with a neighboring vertical transistor cell on the left side and shares a gate trench 1071 of a gate region 107 (half of which is exemplarily illustrated out on the right side) of a neighboring vertical transistor cell on the right side.

Referring to FIG. 5E, a first sidewall body region 105 for each one of the plurality of vertical transistor cells of the semiconductor device 100 may be formed for example by implantation under the shield of the patterned trench-forming mask 503. In an embodiment, dopants of the second conductivity type (e.g. P type) may be implanted into the epitaxial layer 102 with a first predetermined angle $\alpha$ with reference to the second surface of the substrate (e.g. the top surface S1 of the epitaxial layer 102 in the example of FIG. 5E) through a first sidewall (e.g. a right sidewall in the example of FIG. 5E) of each one of the gate trenches 1071 so that the first sidewall body region 105 may be disposed below or underneath the MOSFET source region 103 of each one of the plurality of vertical transistor cells in the epitaxial layer 102. For instance, the first sidewall body region 105 may be disposed between the first source region 103 and the second source region 108. For this example of implanting dopants of the second conductivity type through the first sidewall of each one of the gate trenches 1071 to form the first sidewall body regions 105, concentration of the second conductivity type dopants may be lower than the second source dopant concentration of the second source regions 108 and the first source dopant concentration of the first source regions 103. In an exemplary embodiment, the first predetermined angle $\alpha$ may range from 45 degrees to 85 degrees. Location and dopant concentration of the first sidewall body region 105 of each one of the plurality of vertical transistor cells of the semiconductor device 100 has been described with reference to FIG. 1 in more details and will not be repeated here for simplicity. In an alternative exemplary embodiment, the first sidewall body region 105 for each one of the plurality of vertical transistor cells of the semiconductor device 100 may be formed for example by implantation under the shield of the patterned first implantation mask 501 in place of formation of the lightly doped region 104 in the process described above with reference to FIG. 5B. For this situation, the process of implanting the first sidewall body region 105 described here with reference to FIG. 5E may be saved.

In accordance with an exemplary embodiment of the present invention, still referring to FIG. 5E, a second sidewall body region 109 of the second conductivity type (e.g. P type) may optionally be formed for each one of the plurality of vertical transistor cells of the semiconductor device 100 in the same process for forming the first sidewall body region 105 as described above with reference to FIG. 5E, e.g. sharing the implantation process under the shield of the patterned trench-forming mask 503. For this situation, the optionally formed second sidewall body region 109 may be disposed below or underneath the second source region 108 of each one of the plurality of vertical transistor cells in the epitaxial layer 102. In accordance with an exemplary embodiment of the present invention, in each one of the plurality of vertical transistor cells, the first source region 103, the lightly doped region 104 (if any is formed), the first sidewall body region 105, the second source region 108 and the second sidewall body region 109 (if any is formed) may be vertically arranged along the first sidewall (e.g. the right sidewall in the example shown in FIG. 5E) of each one of the gate trenches 1071 of the gate regions 107. It may be understood that for each single gate trench of each single gate region among the plurality of gate trenches 1071/gate regions 107 of the plurality of vertical transistor cells, a second sidewall body region 109 (if any is formed) may extend from a bottom surface of the second source region 108 vertically down along a first sidewall (e.g. the right sidewall in the example shown in FIG. 5E) of that single gate region 107 until wrapping a first bottom corner (e.g. the right bottom corner in the example shown in FIG. 5E) of that single gate trench 1071. Location and dopant concentration of the second sidewall body region 109 of each one of the plurality of vertical transistor cells of the semiconductor device 100 has been described with reference to FIG. 1 in more details and will not be repeated here for simplicity.

In accordance with an exemplary embodiment of the present invention, now referring to FIG. 5F, a link region 110 of the second conductivity type (e.g. P type) may be formed for each one of the plurality of vertical transistor cells of the semiconductor device 100 for example by implantation still sharing shield from the patterned trench-forming mask 503. In an embodiment, dopants of the second conductivity type (e.g. P type) may be implanted into the epitaxial layer 102 with a second predetermined angle β with reference to the second surface of the substrate (e.g. the top surface S1 of the epitaxial layer 102 in the example of FIG. 5F) through a second sidewall (e.g. a left sidewall in the example of FIG. 5F) of each one of the gate trenches 1071 so that the link region 110 may be formed at least below or underneath the body contact region 106 (if any is formed) of each one of the plurality of vertical transistor cells in the epitaxial layer 102. For the single vertical transistor cell as exemplarily illustrated in FIG. 5F, it may be considered or understood that the link region 110 of that single vertical transistor cell is implanted into the epitaxial layer 102 with a second predetermined angle β with reference to the second surface of the substrate (e.g. the top surface S1 of the epitaxial layer 102 in the example of FIG. 5F) through the second sidewall (e.g. the left sidewall in the example of FIG. 5E) of a gate trench 1071 of a neighboring vertical transistor cell located on the right side of that single vertical transistor cell shown in FIG. 5F. It may be understood that in each one vertical transistor cell of the plurality of vertical transistor cells, the link region 110 may extend from (e.g. the second surface of the substrate or a bottom surface of the body contact region 106) vertically down along a second sidewall (e.g. the left sidewall in the example shown in FIG. 5F) of a gate region 107 of a neighboring vertical transistor cell until wrapping a second bottom corner (e.g. the left bottom corner in the example shown in FIG. 5F) of the gate trench 1071 of the neighboring vertical transistor cell. It may also be understood that for each single gate trench of each single gate region among the plurality of gate trenches 1071/gate regions 107 of the plurality of vertical transistor cells, a link region 110 may extend vertically down along a second sidewall (e.g. the left sidewall in the example shown in FIG. 5F) of that single gate region 107 until wrapping a first bottom corner (e.g. the left bottom corner in the example shown in FIG. 5F) of that single gate trench 1071. In an exemplary embodiment, the second predetermined angle β may range from 45 degrees to 85 degrees. Dopant concentration of the link region 110 has been described with reference to FIG. 1 and will not be repeated here for simplicity. Locations of the link regions 110 of the plurality of vertical transistor cells may be better understood further in conjunction with the illustration of FIG. 1.

In accordance with an exemplary embodiment of the present invention, referring to FIG. 5G, a JFET channel implantation region 111 of the first conductivity type (e.g. N type) may optionally be formed for each one of the plurality of vertical transistor cells of the semiconductor device 100 for example by implantation under the shield of the patterned trench-forming mask 503. In an embodiment, dopants of the first conductivity type (e.g. N type) may be implanted into the epitaxial layer 102 with a third predetermined angle δ with reference to the second surface of the substrate (e.g. the top surface S1 of the epitaxial layer 102 in the example of FIG. 5G) through the second sidewall (e.g. the left sidewall in the example of FIG. 5G) of each one of the gate trenches 1071 so that the JFET channel implantation region 111 may be disposed in the substrate (e.g. in the epitaxial layer 102 in the example of FIG. 5G) closely next to or in adjoining neighbor to the link region 110 in each one of the plurality of vertical transistor cells. In an exemplary embodiment, the third predetermined angle δ may range from 45 degrees to 85 degrees. In the exemplary embodiment illustrated in FIG. 5G, the JFET channel implantation region 111 is illustratively shown to be formed along and in conformal with the link region 110 in each one of the plurality of vertical transistor cells. In an embodiment, the JFET channel implantation region 111 may be in contact with the body contact region 106 (if any is formed) above and with the link region 110 aside. Location and dopant concentration of the JFET channel implantation region 111 of each one of the plurality of vertical transistor cells has been described in more details with reference to FIG. 1 and will not be repeated here for simplicity.

Now referring to FIG. 5H, a guard region 112 of the second conductivity type (e.g. P type) may optionally be formed below or under the bottom of each gate trench 1071 (or of each gate region 107) for example by implantation still under the shield of the patterned trench-forming mask 503. In an exemplary embodiment, dopants of the second conductivity type (e.g. P type) may be implanted vertically into the epitaxial layer 102 through the opening of each gate trench 1071 and under the shield of the patterned trench-forming mask 503. Location and dopant concentration of the guard region 112 of each one of the plurality of vertical transistor cells has been described in more details with reference to FIG. 1 and will not be repeated here for simplicity.

In accordance with an exemplary embodiment, the patterned trench-forming mask 503 may be removed after the implantation processes for forming the first sidewall body regions 105, the second sidewall body regions 109 (if any are optionally formed), the link regions 110, the JFET channel implantation regions 111 (if any are optionally formed), and the guard regions 112 (if any are optionally formed) are completed.

Now referring to FIG. 5I, an implant activation process may be performed to electrically activate atoms of the first type dopants and second type dopants that are implanted in the substrate (e.g. in the epitaxial layer 102) in the previous implantation steps. In an embodiment, the implant activation process may comprise annealing the entire structure formed after the patterned trench-forming mask 503 has been removed (i.e. the structure including the semiconductor 101 and the epitaxial layer 102 with gate trenches 1071 opened therein and first type dopants and second type dopants implanted therein in the previous implantation steps).

In accordance with an exemplary embodiment of the present invention, now referring to FIG. 5J, a gate insulation layer 1072 may be formed to coat and line the sidewalls and bottom of each gate trench 1071 as well as the second surface of the substrate (e.g. the top surface S1 of the epitaxial layer 102 in the example of FIG. 5J). In an embodiment, for example, for the situation where the substrate or the epitaxial layer 102 comprising semiconductor materials such as Si, Ge, SiC that can be oxidized, the gate insulation layer 1072 may be formed by thermal oxidation or by depositing insulation materials such as TEOS gate oxide or by combination of thermal oxidation and insulation material deposition. In an embodiment, for example, for the situation where the substrate or the epitaxial layer 102 comprising semiconductor materials such as GaN, GaAs that cannot be oxidized, the gate insulation layer 1072 may be formed by depositing insulation materials such as TEOS gate oxide. In an embodiment, the gate insulation layer 1072 may be formed to have a predetermined gate insulation thickness T1. In an embodiment, the predetermined gate insulation thickness T1 may range from 20 nm to 100 nm.

In accordance with an exemplary embodiment of the present invention, now referring to FIG. 5K, a gate conductive material 1073 (such as heavily-doped polysilicon) may be applied/used to fill each one of the gate trenches 1071 until an excessive thickness of the gate conductive material 1073 is accumulated over the second surface of the substrate (e.g. the top surface S1 of the epitaxial layer 102 in the example of FIG. 5K). In an embodiment, the gate conductive material 1073 may be applied to fill the gate trenches 1071 by deposition.

In accordance with an exemplary embodiment of the present invention, now referring to FIG. 5L, an etching back process may be performed to remove the excessive thickness of the gate conductive material 1073 accumulated over the top surface S1 until the gate insulation layer 1072 on the second surface of the substrate (e.g. the top surface S1 of the epitaxial layer 102 in the example of FIG. 5L) is exposed.

In accordance with an exemplary embodiment of the present invention, now referring to FIG. 5M, an oxidation process may be performed to oxidize an uppermost portion of the gate conductive material 1073 in each one of the gate trenches 1071 to form a gate capping layer 1074. During this process, while the gate conductive material 1073 is oxidized, the substrate (e.g. the epitaxial layer 102) coated/shielded by the gate insulation layer 1072 remains un-oxidized, for example, especially when the epitaxial layer 102 is formed of SiC or other semiconductor materials alike. In an embodiment, the gate capping layer 1074 may be formed to a thickness T3 greater than the predetermined gate insulation thickness T1 in this step.

In accordance with an exemplary embodiment of the present invention, now referring to FIG. 5N, the gate insulation layer 1072 located on the top surface S1 of the epitaxial layer 102 is removed for example by an etching back process to expose areas of the second surface of the substrate (e.g. the top surface S1 of the epitaxial layer 102) un-coated by the gate capping layer 1074. During this process, an upper portion of the gate capping layer 1074 may also be removed resulting in thickness loss. That is to say, after this process, the remained gate capping layer 1074 may have a predetermined capping thickness T2 thinner than the thickness T3. In other words, during this process, thickness of the gate capping layer 1074 is reduced from the thickness T3 to the predetermined capping thickness T2. In an embodiment, the thickness T3 should be greater than a sum of the predetermined gate insulation thickness T1 and the predetermined capping thickness T2 to ensure that the remained gate capping layer 1074 has the predetermined capping thickness T2 after this etching back process.

In accordance with an exemplary embodiment of the present invention, now referring to FIG. 5O, a metal layer 507 used for subsequent silicidation may be deposited on the entire exposed top surface of the structure formed after the process shown in FIG. 5N. In an embodiment, the metal layer 507 may comprise a nickel layer for example. In other embodiment, the metal layer 507 may comprise other materials that can react with the epitaxial layer 102.

In accordance with an exemplary embodiment of the present invention, now referring to FIG. 5P, a silicidation process may be performed to form a silicide layer 113 on the second surface of the substrate (e.g. on the top surface S1 of the epitaxial layer 102 in the example of FIG. 5P). The silicide layer 113 may result from the metal layer 507 reacting with the semiconductor material of the substrate (e.g. of the epitaxial layer 102) and thus is self-aligned with the exposed semiconductor material of the substrate, e.g. of the epitaxial layer 102 (un-coated by the gate capping layer 1074) after the process of FIG. 5N. That is to say, the silicide layer 113 may be self-aligned with portions of the substrate (e.g. portions of the epitaxial layer 102 in an example) unoccupied by the gate regions 107 of the plurality of vertical transistor cells. A strip process may be performed after the silicidation process to remove and clean the remained metal layer 507 (e.g. Nickel in the example of FIG. 5P) non-silicidized, i.e. un-reacted with the epitaxial layer 102.

In accordance with an exemplary embodiment of the present invention, now referring to FIG. 5Q, an interlayer dielectric ("ILD") layer 114 may be formed for example by depositing dielectric materials on the entire top surface of the structure obtained after the process shown in FIG. 5P.

In accordance with an exemplary embodiment of the present invention, now referring to FIG. 5R, a source contact trench and a gate contact trench may be formed in the interlayer dielectric layer 114 for each one of the plurality of vertical transistor cells for example by etching through the interlayer dielectric layer 114. The source contact trench for each one of the plurality of vertical transistor cells may vertically extend from a top surface of the interlayer dielectric layer 114 down through the interlayer dielectric layer 114 to reach and expose at least a portion of the silicide layer 113 atop the MOSFET source region 103, the body contact region 106 (if any is formed) and/or the link region 110 (if the link region 110 extends from the second surface of the substrate vertically down) of each vertical transistor cell. The gate contact trench for each one of the plurality of vertical transistor cells may vertically extend from a top surface of the interlayer dielectric layer 114 down through the interlayer dielectric layer 114 to reach and expose at least a portion of the gate conductive material 1073 of each vertical transistor cell.

In accordance with an exemplary embodiment of the present invention, now referring to FIG. 5S and FIG. 5T, a source metal contact 115 and a gate metal contact 116 may be formed for example by a metal deposition process to fill the source contact trench and the gate contact trench for each one of the plurality of vertical transistor cells and followed by an etching process to separate the source metal contact 115 from the gate metal contact 116. In the example of FIG. 5S, metal deposition is exemplarily shown as by electro-plating. An electro-conductive seed layer 508 comprising for instance Ti or TiW may be formed on the entire exposed surface (e.g. including exposed sidewalls and bottoms of the source contact trenches and gate contact trenches and top surface of the interlayer dielectric layer 114) of the structure obtained after the process shown in FIG. 5R. A metal layer 509 for instance comprising Ai or Cu may subsequently be electro-plated on the electro-conductive seed layer 508 to fill the source contact trenches and gate contact trenches with an excessive thickness accumulated over the top surface of the interlayer dielectric layer 114. In the example of FIG. 5T, an etching process may be performed to etch the metal layers (e.g. including the metal layer 509 and the electro-conductive seed layer 508) formed in the metal deposition process of FIG. 5S into separated source metal contact 115 and gate metal contact 116 for each one of the plurality of vertical transistor cells of the semiconductor device 100. More than one vertical transistor cell is exemplarily illustrated out in the cross-sectional view shown in FIG. 5T to help better understanding the embodiments of the present invention.

Figure 6:
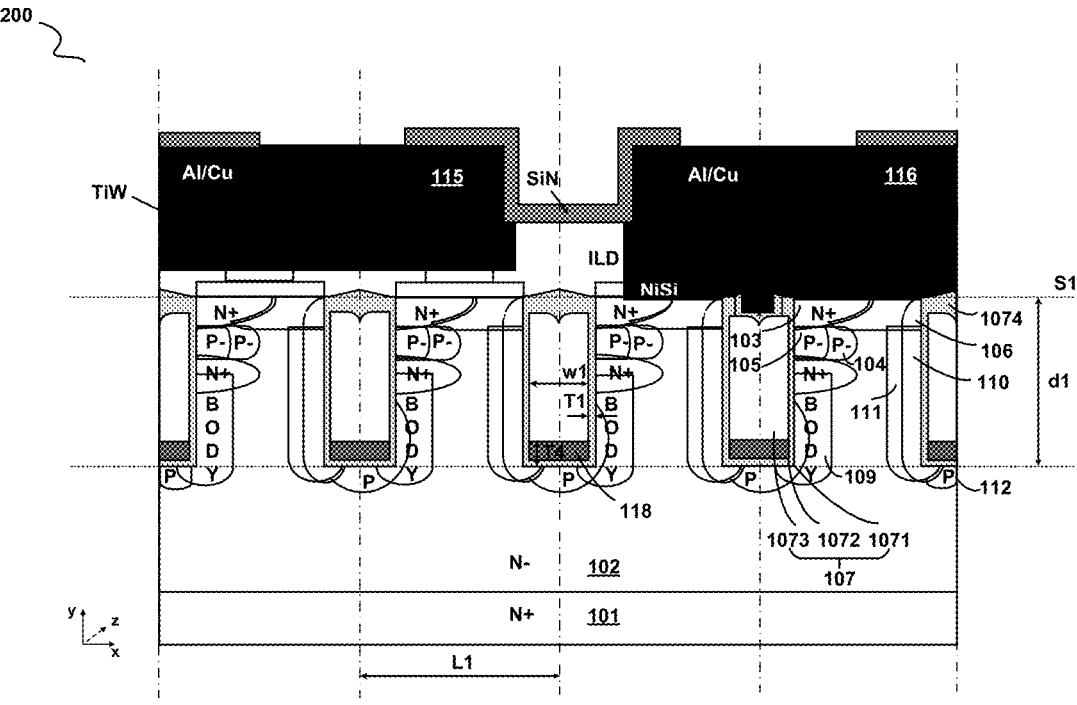
FIG. 6 illustrates a partial cross sectional view of a semiconductor device 200 in accordance with an alternative embodiment of the present invention.

FIG. 6 illustrates a partial cross sectional view of a semiconductor device 200 in accordance with an alternative embodiment of the present invention. Compared with the semiconductor device 100 shown in FIG. 1, the semiconductor device 200 shown in FIG. 6 may further comprise a thick bottom oxide ("TBO") layer 118 formed at the bottom of the gate region 107 (e.g. at the bottom of the gate trench 1071) of each one of the plurality of vertical transistor cells. In an embodiment, the TBO layer 118 may be formed for example by depositing insulation materials (e.g. identical to that of the gate insulation layer 1072) at the bottom of each one of the gate trenches 1071 so that an insulation material thickness at the bottom of each gate trench 1071 reaches to a predetermined bottom insulation thickness T4 greater than the predetermined gate insulation thickness T1. The predetermined bottom insulation thickness T4 may be determined by a sum of the predetermined gate insulation thickness T1 and a thickness of the TBO layer 118. In an embodiment, the predetermined bottom insulation thickness T4 may range from 50 nm to 1 um. Compared with the semiconductor device 100, the TBO layer 118 may help to reduce a gate charge of the semiconductor device 200 and thus reducing switching loss during the semiconductor device 200 is used or applied to perform on and off switching in practical applications. One of ordinary skill in the art would understand that a gate charge of a vertical transistor may refer to charge that needs to be supplied to the gate of the vertical transistor to switch the vertical transistor on/off.

Figures 7, 8:
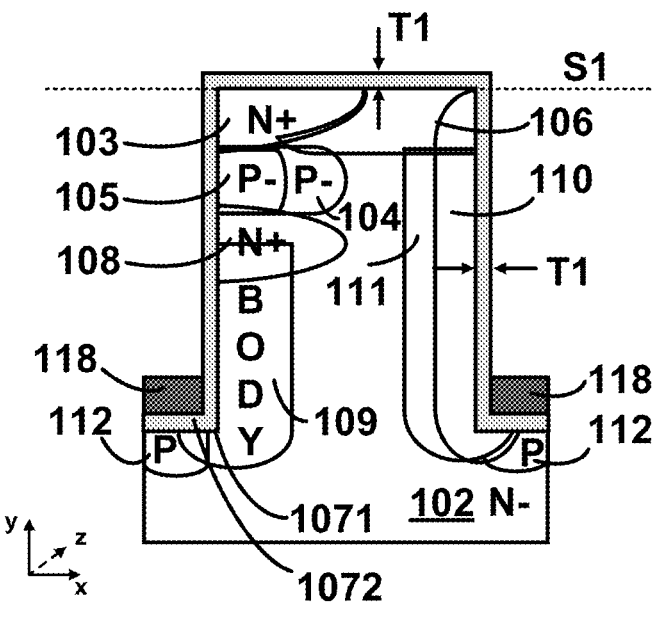
FIG. 7 illustrates a partial cross sectional view showing a TBO layer formation process that may be performed between the step shown in FIG. 5J and the step shown in FIG. 5K in a method for manufacturing a semiconductor device (for example, the semiconductor device 200 of FIG. 6) in accordance with an embodiment of the present invention.
FIG. 8 illustrates a partial cross sectional view of a semiconductor device 300 in accordance with an alternative embodiment of the present invention.

Those skilled in the art should understand that the above descriptions to the semiconductor device 100 and related manufacturing methods of the various embodiments of the present disclosure made with reference to FIG. 1 to FIG. 5T are applicable to the semiconductor device 200 in the example of FIG. 6. Thus, a method for manufacturing the semiconductor device 200 is disclosed and may be understood with reference to the descriptions above related to the cross-sectional views illustrated in FIG. 5A to FIG. 5T. Difference of the method for manufacturing the semiconductor device 200 from the method for manufacturing the semiconductor device 100 described above lies in that an additional TBO layer formation process as illustrated in the partial cross-sectional view of FIG. 7 may be performed between the step shown in FIG. 5J and the step shown in FIG. 5K. Referring to FIG. 7, after the gate insulation layer 1072 have been formed in the step shown in FIG. 5J, a TBO layer 118 may be formed for example by depositing insulation materials (e.g. identical to that of the gate insulation layer 1072) at the bottom of each one of the gate trenches 1071 so that an insulation material thickness at the bottom of each gate trench 1071 reaches to a predetermined bottom insulation thickness T4 greater than the predetermined gate insulation thickness T1. Following the TBO layer formation process illustrated in FIG. 7, manufacturing steps as illustrated in FIG. 5K to FIG. 5T and as previously described with reference to FIG. 5K to FIG. 5T will be performed to manufacture the semiconductor device 200. That is, the method for manufacturing the semiconductor device 200 may comprise the manufacturing steps as illustrated in FIG. 5A to FIG. 5J, FIG. 7, and FIG. 5K to FIG. 5T.

FIG. 8 illustrates a partial cross sectional view of a semiconductor device 300 in accordance with an alternative embodiment of the present invention. Compared with the semiconductor device 100 shown in FIG. 1, the semiconductor device 300 may use a buried layer 308 of the first conductivity type (e.g. N type) to implement the second source region 108 of each one of the vertical transistor cells as described with reference to FIG. 1. In other words, the buried layer 308 functions as the second source region or the JFET source region of each one of the vertical transistor cells of the semiconductor device 300. Dopant type, dopant concentration and functionality of the buried layer 308 may be the same as that described for the second source region 108 and will not be repeated here for simplicity.

Figure 9A:
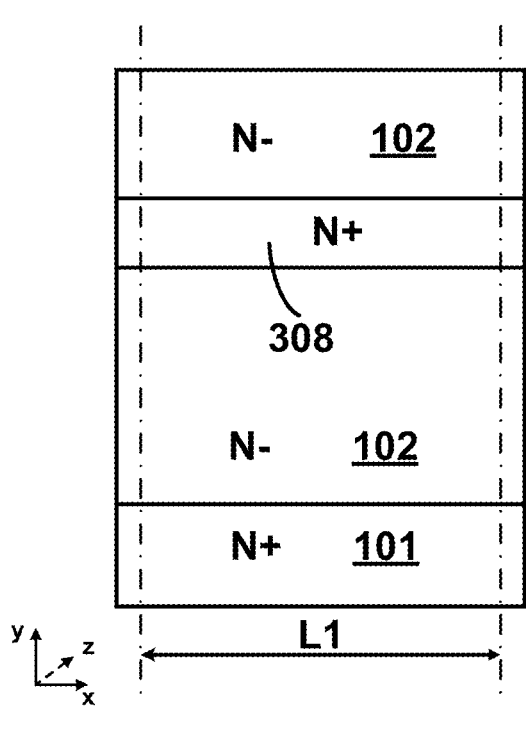
FIG. 9A and FIG. 9B illustrate partial cross sectional views showing processes to respectively replace the steps in FIG. 5A and FIG. 5B in a method for manufacturing a semiconductor device (for example, the semiconductor device 300 of FIG. 8) in accordance with an embodiment of the present invention.

Those skilled in the art should understand that the above descriptions to the semiconductor device 100 and related manufacturing methods of the various embodiments of the present disclosure made with reference to FIG. 1 to FIG. 5T are applicable to the semiconductor device 300 in the example of FIG. 8. Thus, a method for manufacturing the semiconductor device 300 is disclosed and may be understood with reference to the descriptions above related to the cross-sectional views illustrated in FIG. 5A to FIG. 5T. Difference of the method for manufacturing the semiconductor device 300 from the method for manufacturing the semiconductor device 100 described above lies in that preparation of the epitaxial layer 102 may further include an additional buried layer formation process, now referring to the partial cross-sectional view as illustrated in FIG. 9A in place of the process illustrated in FIG. 5A. Difference of the method for manufacturing the semiconductor device 300 from the method for manufacturing the semiconductor device 100 described above further lies in that implantation process for forming the JFET source region 108 as described with reference to FIG. 5B can be omitted, now referring to the partial cross-sectional view as illustrated in FIG. 9B in place of the process illustrated in FIG. 5B.

Referring to FIG. 9A, a first portion (e.g. a lower portion) of the epitaxial layer 102 may be formed on the semiconductor layer 101 just as described above with reference to FIG. 5A, then a buried layer 308 of the first conductivity type (e.g. N type) may be formed in or on the first portion of the epitaxial layer 102, and in the following a second portion (e.g. an upper portion) of the epitaxial layer 102 may be formed on the buried layer 308. In an exemplary embodiment, the buried layer 308 may be formed by implanting dopants of the first conductivity type into the first portion (e.g. the lower portion) of the epitaxial layer 102. In an alternative exemplary embodiment, the buried layer 308 may be formed by an epitaxial process atop the first portion (e.g. the lower portion) of the epitaxial layer 102. For instance, the epitaxial process for forming the buried layer 308 may include growing the buried layer 308 by vapor phase epitaxy deposition of semiconductor materials doped with dopants of the first conductivity type. In this fashion, one of ordinary skill in the art would understand that the buried layer 308 is sandwiched between the first portion (lower portion) and the second portion (upper portion) of the epitaxial layer 102. The buried layer 308 may have a higher dopant concentration than the epitaxial dopant concentration of the epitaxial layer 102. The buried layer 308 may be used to function as the second source region (i.e. the JFET source region) of the semiconductor device 300 and may have a dopant concentration the same as that described for the second source region 108 of the semiconductor device 100. Advantages of using the buried layer 308 to function as the second source region of the semiconductor device 300 at least include that the second source region 308 can be disposed deeper from the second surface of the substrate (e.g. the top surface S1 of the epitaxial layer 102) without having to use very high energy implantation process, which may be useful for further improving performance of the semiconductor device 300. In an embodiment, the buried layer 308 may be formed to have a buried layer thickness ranging from 0.1 μm to 1.0 μm. In an embodiment, the upper portion of the epitaxial layer 102 may have a thickness ranging from 0.1 μm to 1.0 μm.

Figure 9B:
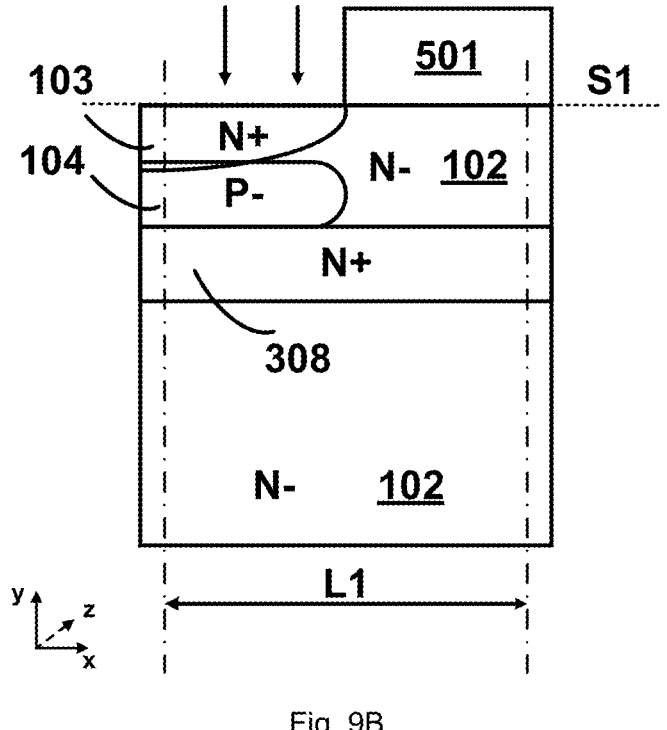

Following the process as illustrated in FIG. 9A, now referring to FIG. 9B, a lightly doped region (e.g. the lightly doped region 104) and a MOSFET source region (e.g. the MOSFET source region 103) may be formed in the second portion (i.e. the upper portion) of the epitaxial layer 102 by implantation for each one of the plurality of vertical transistor cells of the semiconductor device 300 under the shield of a patterned first implantation mask 501. Compared to the process illustrated in FIG. 5B, the implantation process for forming the JFET source region 108 is skipped or omitted in the process illustrated in FIG. 9B. The patterned first implantation mask 501 may be formed on the top surface S1 of the epitaxial layer 102 and be patterned to expose pre-defined areas on the top surface S1 of the epitaxial layer 102 where dopants to form the lightly doped region 104 (if any) and the MOSFET source region 103 of each one of the plurality of vertical transistor cells of the semiconductor device 300 would be implanted in. The patterned first implantation mask 501 may be removed after the implantation processes for forming the lightly doped regions 104 and the MOSFET source regions 103 are completed. In an exemplary embodiment, the lightly doped regions 104 may be optional and may not be formed and thus implantation process for forming the lightly doped regions 104 may be saved. Conductivity type (or dopant type) and dopant concentration of the lightly doped region 104 (if any) and the MOSFET source region 103 have been described with reference to FIG. 1 and will not be repeated here for simplicity.

Following the process illustrated in FIG. 9B, manufacturing steps as illustrated in FIG. 5C to FIG. 5T and as previously described with reference to FIG. 5C to FIG. 5T will be performed to manufacture the semiconductor device 300. That is, the method for manufacturing the semiconductor device 300 may comprise the manufacturing steps as illustrated in FIG. 9A, FIG. 9B and FIG. 5C to FIG. 5T.

Figure 10:
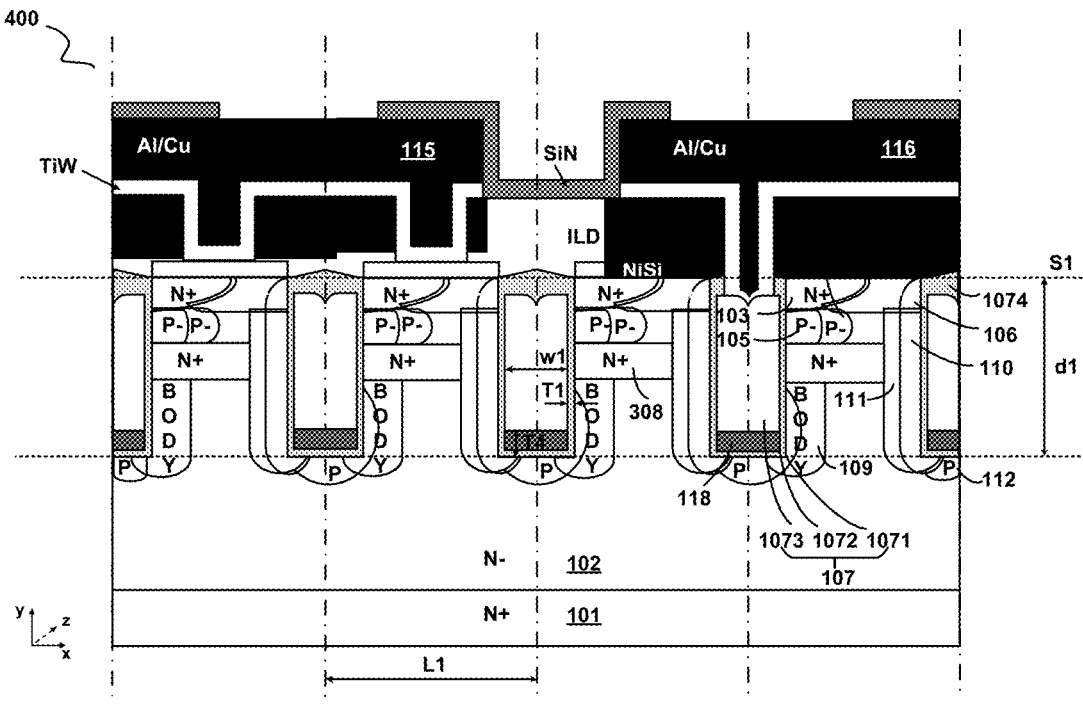
FIG. 10 illustrates a partial cross sectional view of a semiconductor device 400 in accordance with an alternative embodiment of the present invention.

FIG. 10 illustrates a partial cross sectional view of a semiconductor device 400 in accordance with an alternative embodiment of the present invention. Compared with the semiconductor device 300 shown in FIG. 8, the semiconductor device 400 shown in FIG. 10 may further comprise a thick bottom oxide ("TBO") layer 118 formed at the bottom of the gate region 107 (e.g. at the bottom of the gate trench 1071) of each one of the plurality of vertical transistor cells. Descriptions to the TBO layer 118 would be the same as those presented above with reference to FIG. 6 and will not be repeated here for simplicity.

Those skilled in the art should understand that the above descriptions to the semiconductor device 300 and related manufacturing methods of the various embodiments of the present disclosure made with reference to FIG. 1 to FIG. 5T and FIG. 9A and FIG. 9B are applicable to the semiconductor device 400 in the example of FIG. 10. Thus, a method for manufacturing the semiconductor device 400 is disclosed and may be understood with reference to the descriptions above related to the cross-sectional views illustrated in FIG. 9A, FIG. 9B and FIG. 5A to FIG. 5T. Difference of the method for manufacturing the semiconductor device 400 from the method for manufacturing the semiconductor device 300 described above lies in that an additional TBO layer formation process as illustrated in the partial cross-sectional view of FIG. 7 may be performed between the step shown in FIG. 5I and the step shown in FIG. 5J. That is, the method for manufacturing the semiconductor device 400 may comprise the manufacturing steps as illustrated in FIG. 9A, FIG. 9B, FIG. 5C to FIG. 5J, FIG. 7, and FIG. 5K to FIG. 5T.

The advantages of the various embodiments of the present invention are not confined to those described above. These and other advantages of the various embodiments of the present invention will become more apparent upon reading the whole detailed descriptions and studying the various figures of the drawings.

From the foregoing, it will be appreciated that specific embodiments of the present invention have been described herein for purposes of illustration, but that various modifications may be made without deviating from the technology. Many of the elements of one embodiment may be combined with other embodiments in addition to or in lieu of the elements of the other embodiments.

What is claimed is:

1. A semiconductor device, comprising:
   a drain region of a first conductivity type, disposed adjacent a first surface of a substrate of the semiconductor device;
   a first source region of the first conductivity type, disposed adjacent a second surface of the substrate, the second surface being opposite to the first surface;
   a first sidewall body region of a second conductivity type, disposed below or underneath the first source region, the second conductivity type being opposite to the first conductivity type;
   a gate region, disposed next to or in adjoining neighbor to the first source region;
   a second source region of the first conductivity type, disposed below or underneath the first sidewall body region; and
   a link region of the second conductivity type, disposed spatially opposite to the gate region and having a portion extended vertically down into the substrate deeper than the second source region.

27

2. The semiconductor device of claim 1, wherein the substrate includes an epitaxial layer of the first conductivity type disposed on top of a semiconductor layer of the first conductivity type.

3. The semiconductor device of claim 1, further comprising:

a body contact region of the second conductivity type, disposed adjacent to the second surface of the substrate and laterally next to or in adjoining neighbor to the first source region at the first side of the first source region; wherein the body contact region contacts with the first source region and the first sidewall body region, and has a body contact dopant concentration higher than a first body dopant concentration of the first sidewall body region.

4. The semiconductor device of claim 1, wherein the link region is electrically coupled to the first source region.

5. The semiconductor device of claim 1, wherein the gate region is disposed in a gate trench, and wherein the gate region includes a gate insulation layer lining sidewalls and a bottom of the gate trench and a gate conductive material filling the gate trench.

6. The semiconductor device of claim 5, wherein the gate insulation layer has a predetermined gate insulation thickness in a range from 20 nm to 100 nm.

7. The semiconductor device of claim 1, wherein the semiconductor device has a short metal oxide semiconductor effect transistor ("MOSFET") channel in the first sidewall body region, and wherein the short MOSFET channel has a MOSFET channel width in a range from 0.1 $\mu m$ to 0.8 $\mu m$.

8. The semiconductor device of claim 1, wherein the semiconductor device has a total specific on resistance lower than 2.2 m$\Omega$*cm$^2$.

9. The semiconductor device of claim 1, wherein the second source region remains undepleted in an OFF state of the semiconductor device with a drain to source voltage applied between the drain region and the first source region continuously increasing.

10. The semiconductor device of claim 1, wherein the first source region, the first sidewall body region, and the second source region are disposed at a first side of the gate region and vertically arranged along a first sidewall of the gate region.

11. The semiconductor device of claim 1, wherein the link region is disposed at a second side of a neighboring gate region, and extends vertically down along a second sidewall of the neighboring gate region until wrapping a second bottom corner of the neighboring gate region.

12. The semiconductor device of claim 1, further comprising:

a silicide layer formed atop the second surface of the substrate and self-aligned with portions of the substrate unoccupied by the gate region.

13. The semiconductor device of claim 1, further comprising:

a lightly doped region of the second conductivity type, formed below or underneath the first source region in the substrate, wherein the first sidewall body region is disposed in the lightly doped region.

14. The semiconductor device of claim 1, wherein the link region has a link dopant concentration higher than a second source dopant concentration of the second source region.

15. The semiconductor device of claim 1, further comprising:

a second sidewall body region of the second conductivity type, disposed below or underneath the second source region.

16. The semiconductor device of claim 15, wherein the link region is separated by at least a portion of the substrate from the second sidewall body region.

17. The semiconductor device of claim 15, wherein the first source region, the first sidewall body region, the second source region, and the second sidewall body region are disposed at a first side of the gate region and vertically arranged along a first sidewall of the gate region.

18. The semiconductor device of claim 15, wherein the second sidewall body region extends from a bottom surface of the second source region vertically down along a first sidewall of the gate region until wrapping a first bottom corner of the gate region.

19. The semiconductor device of claim 15, further comprising:

a JFET channel implantation region of the first conductivity type, formed in the substrate and disposed closely next to or in adjoining neighbor to the link region.

20. The semiconductor device of claim 19, wherein the link region is separated from the second sidewall body region at least by the JFET channel implantation region.

21. The semiconductor device of claim 19, wherein the JFET channel implantation region is separated by at least a portion of the substrate from the second sidewall body region.

22. The semiconductor device of claim 1, further comprising:

a JFET channel implantation region of the first conductivity type, formed in the substrate and disposed closely next to or in adjoining neighbor to the link region.

23. The semiconductor device of claim 1, further comprising:

a guard region of the second conductivity type, disposed below or under a bottom of the gate region and contacting with the bottom of the gate region.

24. The semiconductor device of claim 1, further comprising:

a thick bottom oxide layer, formed at a bottom of the gate region.

25. The semiconductor device of claim 1, wherein the second source region includes a buried layer of the first conductivity type formed in the substrate.

26. A semiconductor device including a plurality of transistor cells, each one of the plurality of transistor cells comprising:

a drain region of a first conductivity type, disposed adjacent a first surface of a substrate of the semiconductor device;

a first source region of the first conductivity type, disposed adjacent a second surface of the substrate, the second surface being opposite to the first surface;

a first sidewall body region of a second conductivity type, disposed below or underneath the first source region, the second conductivity type being opposite to the first conductivity type;

a gate region, disposed next to or in adjoining neighbor to the first source region;

a second source region of the first conductivity type, disposed below or underneath the first sidewall body region; and a link region of the second conductivity type, disposed spatially opposite to the gate region and having a portion extended vertically down into the substrate deeper than the second source region.

27. The semiconductor device of claim 26, wherein each one of the plurality of transistor cells further includes:

a second sidewall body region of the second conductivity type, disposed below or underneath the second source region.

28. The semiconductor device of claim 26, wherein each one of the plurality of transistor cells further includes:

a JFET channel implantation region of the first conductivity type, formed in the substrate and disposed closely next to or in adjoining neighbor to the link region.

\* \* \* \* \*